(12) United States Patent
Shinozaki et al.

(10) Patent No.: US 8,553,459 B2
(45) Date of Patent: Oct. 8, 2013

(54) NONVOLATILE SEMICONDUCTOR MEMORY DEVICE AND MEMORY SYSTEM HAVING THE SAME

(75) Inventors: Naoharu Shinozaki, Tokyo (JP); Masao Taguchi, Tokyo (JP); Takahiro Hatada, Tokyo (JP); Satoru Sugimoto, Tokyo (JP); Satoshi Sakurakawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 164 days.

(21) Appl. No.: 13/081,094

(22) Filed: Apr. 6, 2011

(65) Prior Publication Data

US 2011/0261622 A1    Oct. 27, 2011

(30) Foreign Application Priority Data

Apr. 22, 2010   (JP) .................................. 2010-098900

(51) Int. Cl.
*G11C 11/34* (2006.01)

(52) U.S. Cl.
USPC .................................................... 365/185.19

(58) Field of Classification Search
USPC ....................................................... 365/185.18
See application file for complete search history.

(56) References Cited

U.S. PATENT DOCUMENTS

| | | | | |
|---|---|---|---|---|
| 5,734,609 A | * | 3/1998 | Choi et al. | 365/185.17 |
| 8,369,155 B2 | * | 2/2013 | Park | 365/185.22 |
| 2003/0095448 A1 | * | 5/2003 | Ichige et al. | 365/200 |
| 2005/0224894 A1 | * | 10/2005 | Ichige et al. | 257/390 |
| 2006/0146608 A1 | * | 7/2006 | Fasoli et al. | 365/185.17 |
| 2009/0213661 A1 | * | 8/2009 | Park et al. | 365/185.22 |
| 2012/0068254 A1 | * | 3/2012 | Sakuma et al. | 257/324 |

FOREIGN PATENT DOCUMENTS

JP    2002-373497    12/2002

* cited by examiner

*Primary Examiner* — Hoai V Ho
*Assistant Examiner* — Pablo Huerta
(74) *Attorney, Agent, or Firm* — Morrison & Foerster LLP

(57) ABSTRACT

A nonvolatile semiconductor memory device includes a first string including a first number of memory cells connected in series each storing therein information in a nonvolatile manner; and a second string including a second number of memory cells connected in series each storing therein information in a nonvolatile manner, wherein the second number is smaller than the first number.

28 Claims, 35 Drawing Sheets

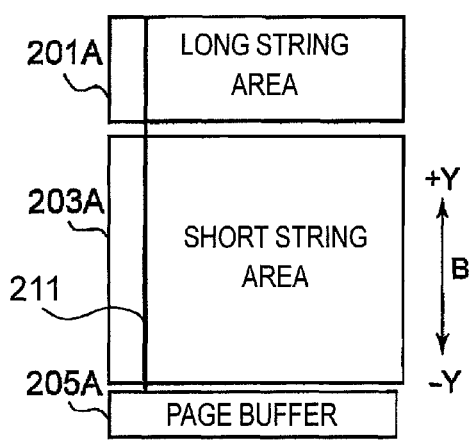
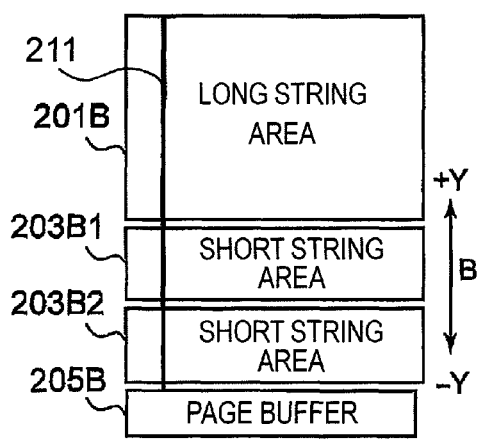
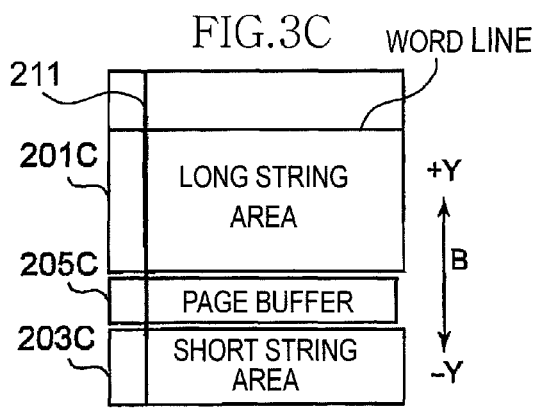
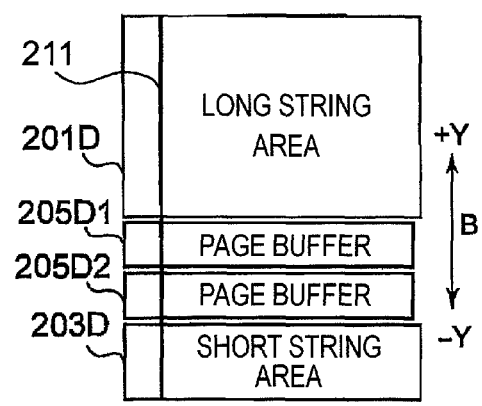
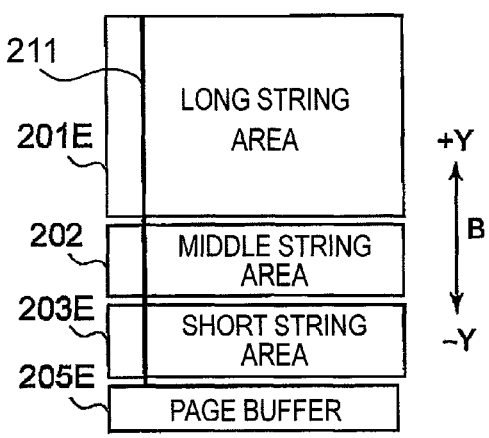

| WL_Add | | | XA | XE | | | | | | | |
|---|---|---|---|---|---|---|---|---|---|---|---|
| <4> | <3> | <2> | <0> | <7> | <6> | <5> | <4> | <3> | <2> | <1> | <0> |
| 0 | 0 | 0 | 0 | 0 | 0 | 0 | 0 | 0 | 0 | 0 | 0 |
| 0 | 0 | 1 | 0 | 0 | 0 | 0 | 0 | 0 | 0 | 0 | 0 |
| 0 | 1 | 0 | 0 | 0 | 0 | 0 | 0 | 0 | 0 | 0 | 0 |
| 0 | 1 | 1 | 0 | 0 | 0 | 0 | 0 | 0 | 0 | 0 | 0 |
| 1 | 0 | 0 | 0 | 0 | 0 | 0 | 0 | 0 | 0 | 0 | 0 |
| 1 | 0 | 1 | 0 | 0 | 0 | 0 | 0 | 0 | 0 | 0 | 0 |
| 1 | 1 | 0 | 0 | 0 | 0 | 0 | 0 | 0 | 0 | 0 | 0 |
| 1 | 1 | 1 | 0 | 0 | 0 | 0 | 0 | 0 | 0 | 0 | 0 |
| 0 | 0 | 0 | 1 | 0 | 0 | 0 | 0 | 0 | 0 | 0 | 1 |
| 0 | 0 | 1 | 1 | 0 | 0 | 0 | 0 | 0 | 0 | 1 | 0 |
| 0 | 1 | 0 | 1 | 0 | 0 | 0 | 0 | 0 | 1 | 0 | 0 |
| 0 | 1 | 1 | 1 | 0 | 0 | 0 | 0 | 1 | 0 | 0 | 0 |
| 1 | 0 | 0 | 1 | 0 | 0 | 0 | 1 | 0 | 0 | 0 | 0 |
| 1 | 0 | 1 | 1 | 0 | 0 | 1 | 0 | 0 | 0 | 0 | 0 |
| 1 | 1 | 0 | 1 | 0 | 1 | 0 | 0 | 0 | 0 | 0 | 0 |
| 1 | 1 | 1 | 1 | 1 | 0 | 0 | 0 | 0 | 0 | 0 | 0 |

FIG.12

| XA<0> | XE<n> | GWLS<m> | GWLSB<m> |
|---|---|---|---|
| 0 | 0 | 0 | 1 |
| 0 | 0 | 1 | 0 |
| 1 | 0 | 0 | 0 |
| 1 | 1 | 0 | 1 |
| 1 | 1 | 1 | 0 |

FIG.14

| WL_Add | | | XA | | | | | | SR | |
|---|---|---|---|---|---|---|---|---|---|---|
| <15> | <14> | <13> | <5> | <4> | <3> | <2> | <1> | <0> | <1> | <0> |
| 0 | 0 | 0 | 0 | 0 | 0 | 0 | 0 | 0 | 0 | 1 |
| 0 | 0 | 1 | 0 | 0 | 0 | 0 | 0 | 0 | 1 | 0 |
| 0 | 1 | 0 | 0 | 0 | 0 | 0 | 0 | 1 | 0 | 0 |
| 0 | 1 | 1 | 0 | 0 | 0 | 0 | 1 | 0 | 0 | 0 |
| 1 | 0 | 0 | 0 | 0 | 0 | 1 | 0 | 0 | 0 | 0 |
| 1 | 0 | 1 | 0 | 0 | 1 | 0 | 0 | 0 | 0 | 0 |
| 1 | 1 | 0 | 0 | 1 | 0 | 0 | 0 | 0 | 0 | 0 |
| 1 | 1 | 1 | 1 | 0 | 0 | 0 | 0 | 0 | 0 | 0 |

FIG.33

NONVOLATILE SEMICONDUCTOR MEMORY DEVICE AND MEMORY SYSTEM HAVING THE SAME

BACKGROUND OF THE INVENTION

1. Field of the Invention

The present invention relates to a nonvolatile semiconductor memory device and a memory system including the nonvolatile semiconductor memory device.

2. Description of Related Art

There has been known a nonvolatile semiconductor memory device that includes a first memory cell array constituted by a plurality of first strings and a second memory cell array constituted by a plurality of second strings (see Japanese Patent Application Laid-open No. 2002-373497). In this nonvolatile semiconductor memory device, the first memory cell array and the second memory cell array are arranged along a bit line.

In the nonvolatile semiconductor memory device of Japanese Patent Application Laid-open No. 2002-373497, a read path of the first memory cell array and that of the second memory cell array are provided in a separate manner from each other. Specifically, a sense amplifier is arranged on one side of the second memory cell array along a direction of the bit line, and a page buffer is arranged on the other side of the first memory cell array. Data read from the second memory cell array is output through the sense amplifier, and data read from the first memory cell array is output through the page buffer.

According to Japanese Patent Application Laid-open No. 2002-373497, the sense amplifier and the page buffer are arranged in such a manner that they sandwich the first and second memory cell arrays. External terminals of the memory device are arranged at positions far from the sense amplifier and the page buffer. Therefore, this causes both the read path of the first memory cell array and that of the second memory cell array to be increased in length, and as a result, it takes time for transferring the read data to outside.

SUMMARY

As for reading data, a buffer unit is shared by first and second memory cell arrays as a common buffer unit. Specifically, data respectively read from both memory cell arrays are stored in the common buffer unit.

This eliminates the necessity of arranging a plurality of buffers to sandwich the first and second memory cell arrays arranged along a direction of a bit line. Therefore, external terminals of a memory device can be arranged at positions near the common buffer unit, which makes it possible to shorten a transfer path for transferring the read data.

The buffer unit can be either one buffer unit or a plurality of buffer units densely arranged (arranged to be adjacent to each other). When the buffer unit is the densely-arranged buffer units, all the buffer units can be shared by the first and second memory cell arrays, or an alternative configuration can be taken in which one of the buffer units serves as a buffer unit for the first memory cell array and another one of the buffer units serves as a buffer unit for the second memory cell array.

In one embodiment, there is provided a nonvolatile semiconductor memory device comprising: a first string including a first number of memory cells connected in series each storing therein information in a nonvolatile manner; and a second string including a second number of memory cells connected in series each storing therein information in a nonvolatile manner, wherein the second number is smaller than the first number.

BRIEF DESCRIPTION OF THE DRAWINGS

The above features and advantages of the present invention will be more apparent from the following description of certain preferred embodiments taken in conjunction with the accompanying drawings, in which:

FIGS. 3A to 3E show variations of a layout of a cell array and page buffers, where FIG. 3A shows a first variation, FIG. 3B shows a second variation, FIG. 3C shows a third variation, FIG. 3D shows a fourth variation, and FIG. 3E shows a fifth variation;

FIG. 12 shows a truth table of the XE-DEC;

FIG. 14 shows a truth table of the Vx sub-DEC shown in FIG. 13;

FIG. 33 shows a truth table of the SR/XA-DEC;

DETAILED DESCRIPTION OF THE EMBODIMENTS

Exemplary embodiments of the present invention will be explained below in detail with reference to the accompanying drawings.

[First Embodiment]

Figure 1:
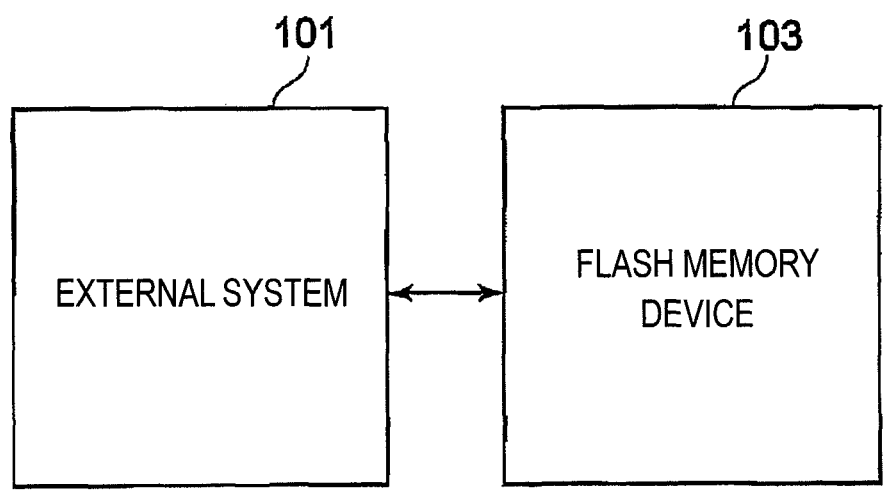
FIG. 1 shows a configuration of a flash memory system according to a first embodiment of the present invention.

FIG. 1 shows a configuration of a flash memory system according to a first embodiment of the present invention.

The flash memory system according to the first embodiment includes a flash memory device 103 and an external system 101 that transmits a command to the flash memory device 103. However, the flash memory system can be a single device including the external system 101 and the flash memory device 103 therein. In addition, the flash memory system can be configured in such a manner that the flash memory device 103 is a portable memory medium so that the flash memory device 103 is externally connected to the external system 101 in a removable manner.

The flash memory device 103 is a NAND flash memory device to which a nonvolatile semiconductor memory device according to the first embodiment is applied. In the NAND flash memory device, data access (write or read) is performed in units of pages and data erase is performed in units of blocks. A block is constituted by a plurality of pages.

The external system 101 is a system provided outside the flash memory device 103. For example, the external system 101 is a controller that controls the flash memory device 103. The controller converts an address specified by an access command from a host system (for example, an LBA (Logical Block Address)) into a word line address that is described later, and specifies a converted address in the flash memory device 103. The host system is, for example, an information processing apparatus such as a digital camera or a personal computer and exists outside the controller. The host system transmits an access command specifying an address (a write command, a read command and the like). The external system 101 can be the host system as well as the controller (in this case, the controller is incorporated in the flash memory device 103).

Figure 2:
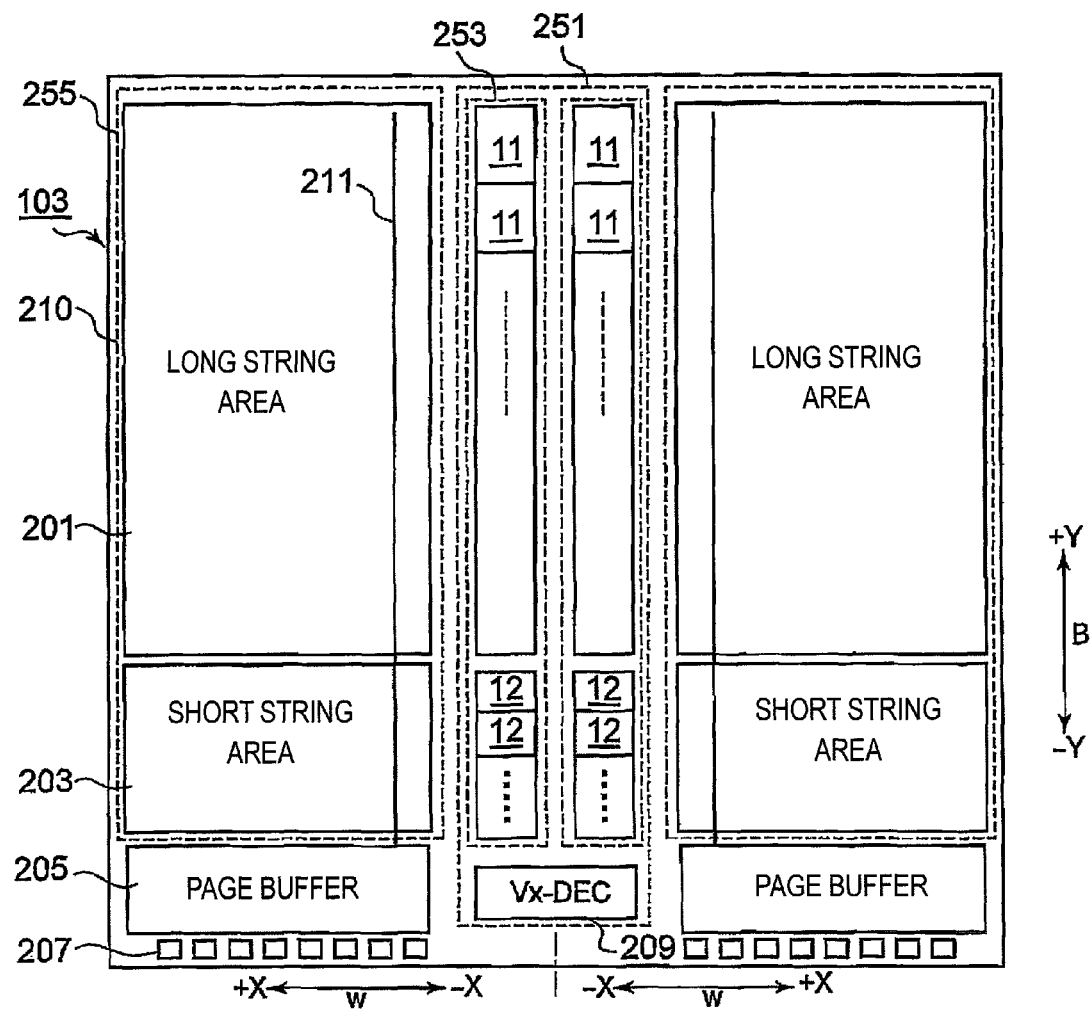
FIG. 2 shows a configuration of a flash memory device.

FIG. 2 shows a configuration of the flash memory device 103.

The flash memory device 103 includes a substrate 210. Long string areas 201, short string areas 203, page buffer 205, a plurality of external terminals 207, and a DEC (decoder) unit 251 are arranged on the substrate 210. The DEC unit 251 includes an X-DEC unit 253 and a Vx-DEC 209. The X-DEC unit 253 includes long X-DECs 11, short X-DECs 12, and an XE-DEC, which is described later.

Two memory planes 255 are arranged on the substrate 210 (the number of memory planes 255 can be larger or smaller than two). Each of the memory planes 255 includes a set of the long string area 201 and the short string area 203. A set of the page buffer 205 and the X-DEC unit 253 is provided for each of the memory planes 255. Each of the memory planes 255 is an area that is controlled by the set of the page buffer 205 and the X-DEC unit 253.

In the following explanations, a direction along a bit line is referred to as "Y direction". The bit line is extending from the page buffer 205, and a direction in which the page buffer 205 extends is referred to as "+Y direction" and a direction opposite to the +Y direction is referred to as "−Y direction".

Furthermore, in the following explanations, a direction orthogonal to the Y direction (a direction along a word line) is referred to as "X direction". The word line is extending from the X-DEC unit 253, and a direction in which the word line extends is referred to as "+X direction" and a direction opposite to the +X direction is referred to as "−X direction". For the memory plane 255 on the left side, the left direction is the +X direction and the right direction is the −X direction. On the other hand, for the memory plane 255 on the right side, the left side is the −X direction and the right side is the +X direction. It is because the memory plane 255 on the left side is controlled by the X-DEC unit 253 located on the right side of the memory plane 255 and the memory plane 255 on the right side is controlled by the X-DEC unit 253 located at the left side of the memory plane 255. More specifically, the X-DEC units 253 are arranged to be adjacent to each other in a lateral direction, where the X-DEC unit 253 on the left side controls the memory plane 255 on the left side and the X-DEC unit 253 on the right side controls the memory plane 255 on the right side.

Explanations are continued below focusing on one of the two memory planes 255.

The long string area 201 is a memory cell array (core array) constituted by a long string. Specifically, the long string area 201 is constituted by a plurality of blocks (or a single block), and each of the blocks is constituted by a plurality of long strings sharing a plurality of word lines. The long string area is constituted by a plurality of memory cells arranged in a matrix form, and the long string is constituted by a plurality of memory cells connected in series. The number of memory cells (string length) of the long string is N (N is a positive integer equal to or larger than 2). In the first embodiment, N is 32.

The short string area 203 is a memory cell array constituted by a short string. The short string is a string having a less number of memory cells than the long string, in other words, a string having a shorter string length than the long string. Specifically, the short string area 203 is constituted by a plurality of blocks (or one block), and each of the blocks is constituted by a plurality of short strings sharing at least one word line. The short string area is constituted by a plurality of memory cells arranged in a matrix form, and the short string is constituted by a plurality of memory cells connected in series. The number of memory cells (string length) of the short string is M (M is a positive integer smaller than N). In the first embodiment, M is 4.

The page buffer 205 is connected to both the long string area 201 and the short string area 203 through a bit line 211. Although the bit line 211 is common to the long string area 201 and the short string area 203, the bit line can be different for each of the long string area 201 and the short string area 203. Data read from memory cells of the long string area 201 and the short string area 203 are temporarily stored in the page buffer 205. In addition to the data read from the memory cells of the long string area 201 and the short string area 203, data programmed in any one of cells of the long string area 201 and the short string area 203 can be temporarily stored in the page buffer 205.

The external terminals 207 are terminals to be connected to the external system 101 (for example, a bonding pad).

The long X-DEC 11 is a word line decoder corresponding to a block in the long string area 201. A plurality of X-DECs 11 respectively corresponding to a plurality of blocks are arranged along the Y direction.

The short X-DEC 12 is a word line decoder corresponding to a block in the short string area 203. The short X-DEC 12 is provided in a separate manner from the long X-DEC 11. A plurality of short X-DECs 12 respectively corresponding to a plurality of blocks are arranged along the Y direction.

The Vx-DEC 209 is a circuit that generates a voltage for the word line and supplies the voltage to the word line. The Vx-DEC 209 is common to the long string area 201 and the short string area 203.

As shown in FIG. 2, for at least the read operation, one page buffer 205 is common to the long string area 201 and the short string area 203. This makes it possible to arrange the external terminals 207 through which the read data passes near the page buffer 205. Arranging the external terminals 207 near the page buffer 205 contributes to a downsizing of the flash memory device 103.

Furthermore, as shown in FIG. 2, the short string area 203 is arranged closer to the page buffer 205 than the long string area 201. Specifically, the short string area 203 is arranged between the long string area 201 and the page buffer 205. Therefore, in a read operation of reading data from the short string area 203, a load on the bit line 211 is reduced, so that a high-speed read operation can be expected. With this configuration, the short X-DECs 12 arranged in the Y direction are arranged on the -Y direction side with respect to the long X-DECs 11 arranged in the Y direction, and the Vx-DECs 209 are arranged in the -Y direction with respect to the short X-DECs 12 arranged in the Y direction.

It is preferable that a distance between the short string area 203 and the page buffer 205 be as short as possible. Although a transistor constituting the short string area 203 and a transistor constituting the page buffer 205 are different from each other, the distance between the short string area 203 and the page buffer 205 can be a distance caused by a difference between the transistors.

Although the layout of the memory cell array (core array) and the page buffer is not limited to the above configuration, it is preferable that the maximum distance between the page buffer and the short string area along the bit line be shorter than the maximum distance between the page buffer and the long string area along the bit line.

Because the long string area 201 has a larger number of memory cells of the string than the short string area 203, it has higher area efficiency than the short string area 203. Therefore, in the first embodiment, data having a relatively large size, for example, a data body of a file is programmed in the long string area 201.

On the other hand, a read operation of reading data from the short string area 203 is faster than a read operation of reading data from the long string area 201. In addition, the read operation of reading data from the short string area 203, can operate the bit line 211 faster than the read operation of reading data from the long string area 201, putting less stress on the operation. Therefore, in the first embodiment, for example, at least one of boot code data that is code data required for booting the external system 101, code data of a computer program to be executed in the external system 101, and management data that is data indicating a location of data is programmed in the short string area 203.

If the boot code data is stored in the short string area 203, the following advantages can be expected. In the case of a boot system, generally, a memory is required for storing the boot code data (for example, a RAM (Random Access Memory), hereinafter, "boot memory"). However, if the boot code data is stored in the short string area 203 as described above, the boot memory that is used as a cache memory or the external system 101 is not necessary, and it is expected that the time required for accessing the boot memory can be eliminated. After the system is booted (that is, after the boot code data is read from the short string area 203), it is possible to access the long string area 201 or the short string area 203 (in addition to the boot code data, other data can be stored in the short string area 203).

The management data includes, for example, an FAT (File Allocation Table) of a file system and metadata (an index indicating a location of a data body of a file) of a file (for example, an audio file or a movie file). If the management data is programmed in the short string area 203 and data identified by the management data (for example, a data body of a file) is programmed in the long string area 201, the following advantages can be expected. That is, if the management data is read and then data identified by the management data is read, a high-speed read operation can be expected. It is preferable that a beginning address or an address near the beginning address among an address space specified from the external system 101 be allocated on a block in which the management data is stored among blocks of the short string area 203. In addition, in order to read the management data and then to read the data identified by the management data, it is preferable to apply a sequential read technique that is described in a ninth embodiment of the present invention. By applying the sequential read technique according to the ninth embodiment, it is possible to expect a read operation at an even higher speed.

FIGS. 3A to 3E show variations of the layout of the cell array.

The layout of the cell array (core array) and the page buffer 205 is not limited to the layout shown in FIG. 2, but a plurality of variations, for example, the following variations A to E can be considered. A combination of two or more including the layout shown in FIG. 2 and one or more of the layouts of the variations A to E is also applicable. Theses layouts can also be applied to at least one of second to eleventh embodiments of the present invention described later.

FIG. 3A shows the variation A of the layout of the cell array.

As shown in FIG. 3A, a long string area 201A and a short string area 203A are connected to a page buffer 205A through a common bit line 211. The long string area 201A and the short string area 203A are arranged in the same memory plane. Data stored in the long string area 201A and the short string area 203A is read out to the page buffer 205A through the bit line 211. The short string area 203A is arranged closer to the page buffer 205A (-Y direction) than the long string area 201A. Furthermore, an area occupied by the short string area 203A is larger than an area occupied by the long string area 201A. The total memory capacity of storing data in the short string area 203A can be larger than the total memory capacity of storing data in the long string area 201A.

FIG. 3B shows the variation B of the layout of the cell array.

As shown in FIG. 3B, a long string area 201B and two short string areas 203B1 and 203B2 are connected to a page buffer 205B through a common bit line 211. The long string area 201B and the short string areas 203B1 and 203B2 are arranged in the same memory plane. Data stored in the long string area 201B and the two short string areas 203B1 and 203B2 is read out to the page buffer 205B through the bit line 211. The short string areas 203B1 and 203B2 is arranged closer to the page buffer 205B (−Y direction) than the long string area 201B. The number of short string areas can be larger than two. In addition, the number of long string areas can also be equal to or larger than two.

FIG. 3C shows the variation C of the layout of the cell array.

As shown in FIG. 3C, a long string area 201C and a short string area 203C are connected to a page buffer 205C through a common bit line 211. The page buffer 205C is arranged between the long string area 201C and the short string area 203C. Data stored in the long string area 201C and the short string area 203C is read out to the page buffer 205C through the bit line 211.

FIG. 3D shows the variation D of the layout of the cell array.

As shown in FIG. 3D, a long string area 201D is connected to a page buffer 205D1 through a bit line 211. A short string area 203D is connected to a page buffer 205D2. The page buffers 205D1 and 205D2 are arranged to be adjacent to each other in an area between the long string area 201D and the short string area 203D. Data stored in the long string area 201D is readout to the page buffer 205D1 through the bit line 211, and data stored in the short string area 203D is read out to the page buffer 205D2 through the bit line 211. It is preferable that the page buffers 205D1 and 205D2 be arranged close to each other (such that they are adjacent to each other) in the Y direction. If the page buffers are arranged close to each other, it is expected that a distance from either one of the page buffers to the external terminals can be prevented from being increased.

FIG. 3E shows the variation E of the layout of the cell array.

As shown in FIG. 3E, a long string area 201E, a middle string area 202, and a short string area 203E are connected to a page buffer 205E through a common bit line 211. The long string area 201E, the middle string area 202, and the short string area 203E are arranged in the same memory plane. Data stored in the long string area 201E, the middle string area 202, and the short string area 203E is read out to the page buffer 205E through the bit line 211.

It is preferable that the middle string area 202 be arranged in an area between the long string area 201E and the short string area 203E in such a manner that the short string area 203E is arranged on the page buffer 205E side (−Y direction) and the long string area 201E is arranged on the opposite side to the page buffer 205E (+Y direction). The middle string area 202 is a memory cell array provided separately from the long string area 201E and the short string area 203E, which is constituted by a plurality of middle strings. The middle string area is constituted by a plurality of memory cells arranged in a matrix form, and the middle string is constituted by a plurality of memory cells connected in series. The number of memory cells of the middle string is smaller than the number of memory cells of the long string and larger than the number of memory cells of the short string. As shown in FIG. 3E, a memory cell array having a smaller number of memory cells of the string is arranged closer to the page buffer 205E. Because each of the long string area 201E, the middle string area 202, and the short string area 203E has different string length and different distance from the page buffer 205E, the read time, properties and the like are different among them. It is preferable that data be stored in any one of the long string area 201E, the middle string area 202, and the short string area 203E, whichever is a data memory area suitable for the data. It is preferable that the X-DEC unit 253 selects any one of the long string area 201E, the middle string area 202, and the short string area 203E based on a predetermined selection signal. It is preferable that the predetermined signal having three levels respectively corresponding to the long string area 201E, the middle string area 202, and the short string area 203E.

The layouts of the variations A to E are as explained above. Note that the layout is not limited to the layouts shown in FIGS. 2 and 3A to 3E, but a combination of two or more layouts is applicable. For example, a combination of the layout shown in FIG. 2 and the layout of the variation C added with the middle string area can be considered. That is, the short string area and the middle string area can be arranged to sandwich a page buffer and the short string area and the long string area can be arranged to sandwich the page buffer.

The first embodiment is explained below in more detail.

Figure 4:
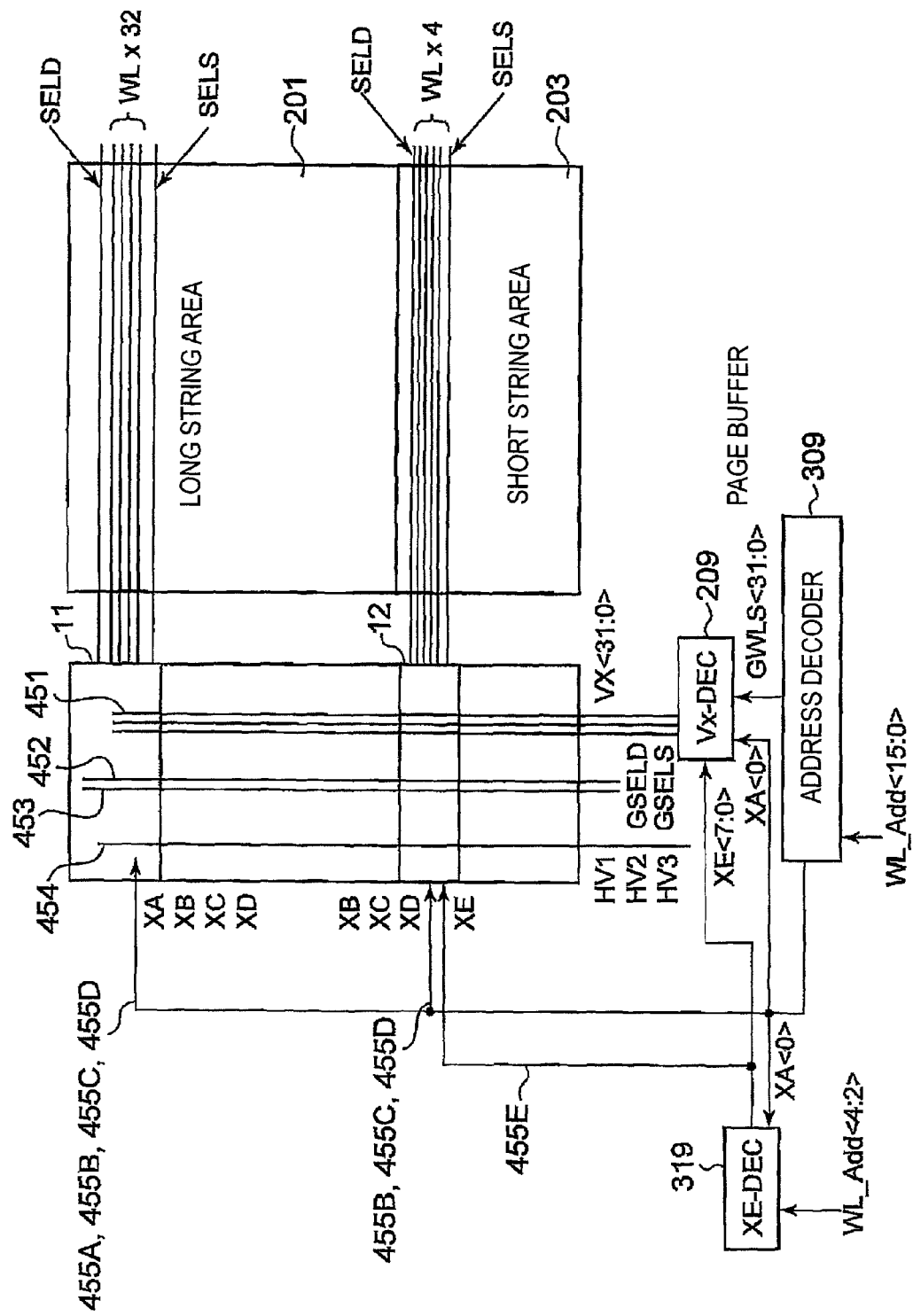
FIG. 4 shows a wiring relevant to an X-DEC unit.

FIG. 4 shows a wiring relevant to the X-DEC unit 253.

A plurality of long X-DECs 11 and a plurality of short X-DECs 12 are respectively arranged along the Y direction. In the first embodiment, the long X-DEC 11 is provided for each block in the long string area 201, and the short X-DEC 12 is provided for each block in the short string area 203.

An address decoder 309 is further included. The address decoder 309 decodes a word line address. The word line address is an address indicating a word line, which, for example, is represented by K bits, where K is a natural number. In the first embodiment, K is 16. Hereinafter, a signal indicating the word line address represented by 16 bits (a word line address signal) is denoted by "WL_Add<15:0>". The word line address signal is a word-line selection signal for selecting a word line. From the word line address signal, a signal indicating a portion from a p-th bit to a q-th bit is denoted by "WL_Add<q:p>". In the following explanations, this way of denoting a signal is also applied to other various signals. In the first embodiment, the decoding is performed as described below:

WL_Add<15:13> is decoded, by which an 8-bit decoded signal XA<7:0> is generated;

WL_Add<12:10> is decoded, by which an 8-bit decoded signal XB<7:0> is generated;

WL_Add<9:7> is decoded, by which an 8-bit decoded signal XC<7:0> is generated;

WL_Add<6:5> is decoded, by which a 3-bit decoded signal XD<3:0> is generated; and WL_Add<4:0> is decoded, by which a 32-bit decoded signal GWLS<31:0> is generated. The signal GWLS<31:0> is input to the Vx-DEC 209.

An XE-DEC 319 is further included. The XE-DEC 319 is a circuit that generates and outputs a decoded signal XE based on a predetermined decoded signal from the address decoder 309 and a predetermined portion of the word line address signal. In the first embodiment, the XE-DEC 319 generates an 8-bit decoded signal XE<7:0> based on XA<0> (a 0-th bit (an end bit) of the XA<7:0>) and WL_Add<4:2>.

A Vx line 451, a GSELD line 452, a GSELS line 453, an HV line 454, and X address decode lines (hereinafter, "X lines") 455A to 455E are further included. All the lines extend in the Y direction.

The Vx line 451 is a power source line through which a word-line voltage signal (hereinafter, "Vx") flows. The Vx line 451 is connected to the Vx-DEC 209. The Vx line 451 is shared by the X-DECs 11 and 12. In the first embodiment, because the number of memory cells of the long string is 32, 32 Vx lines 451 are arranged. Vx<31:0> flows through the 32 Vx lines 451. The 32 Vx lines 451 are connected to the long X-DECs 11, respectively. In addition, because the number of memory cells of the short string is four, every four lines of the 32 Vx lines 451 is allocated to each of the short X-DECs 12. The Vx-DEC 209 supplies a selection WL voltage signal (a voltage signal of a voltage level corresponding to a selected word line (a word line that has been selected)) from the Vx<31:0> through a Vx line 451 corresponding to the selected word line based on the GWLS<31:0>. When a block in the long string area 201 is selected, all of the Vx<31:0> become the selection WL voltage signals. On the other hand, when a block in the short string area 203 is selected, only a Vx supplied through four Vx lines 451 corresponding to four word lines allocated to the selected block becomes the selection WL voltage signal.

The GSELD line 452 is a power source line for an SELD, and the GSELS line 453 is a power source line for an SELS. The GSELD line 452 and the GSELS line 453 are also shared by the X-DECs 11 and 12. The SELD is a transistor connected to an end cell of memory cells on one side connected in series in a single string, which is a selected transistor of which the drain is connected to its corresponding bit line. The SELS is a transistor connected to an end cell of memory cells on the other side connected in series in a single string, which is a selected transistor of which the source is connected to a common source line.

The HV line 454 is a power source line for assisting the decoding. The HV line 454 is connected to level shifters included in the X-DECs 11 and 12. For example, there are three HV lines 454 including an HV1 line, and HV2 line, and an HV3 line. The HV lines are also shared by the X-DECs 11 and 12.

The X lines 455A to 455E are signal lines through which a signal used for selecting/non-selecting a block among the decoded signals of the word line address signal input from the external system 101 flows. In the first embodiment, the X lines include the following types:

eight XA lines 455A through which the XA<7:0> flows;
eight XB lines 455B through which the XB<7:0> flows;
eight XC lines 455C through which the XC<7:0> flows;
four XD lines 455D through which the XD<3:0> flows; and
eight XE lines 455E through which the XE<7:0> flows.

The XA line 455A to the XD line 455D are connected to the long X-DEC 11, and the XB line 455B to XE line 455E are connected to the short X-DEC 12.

Figure 5:
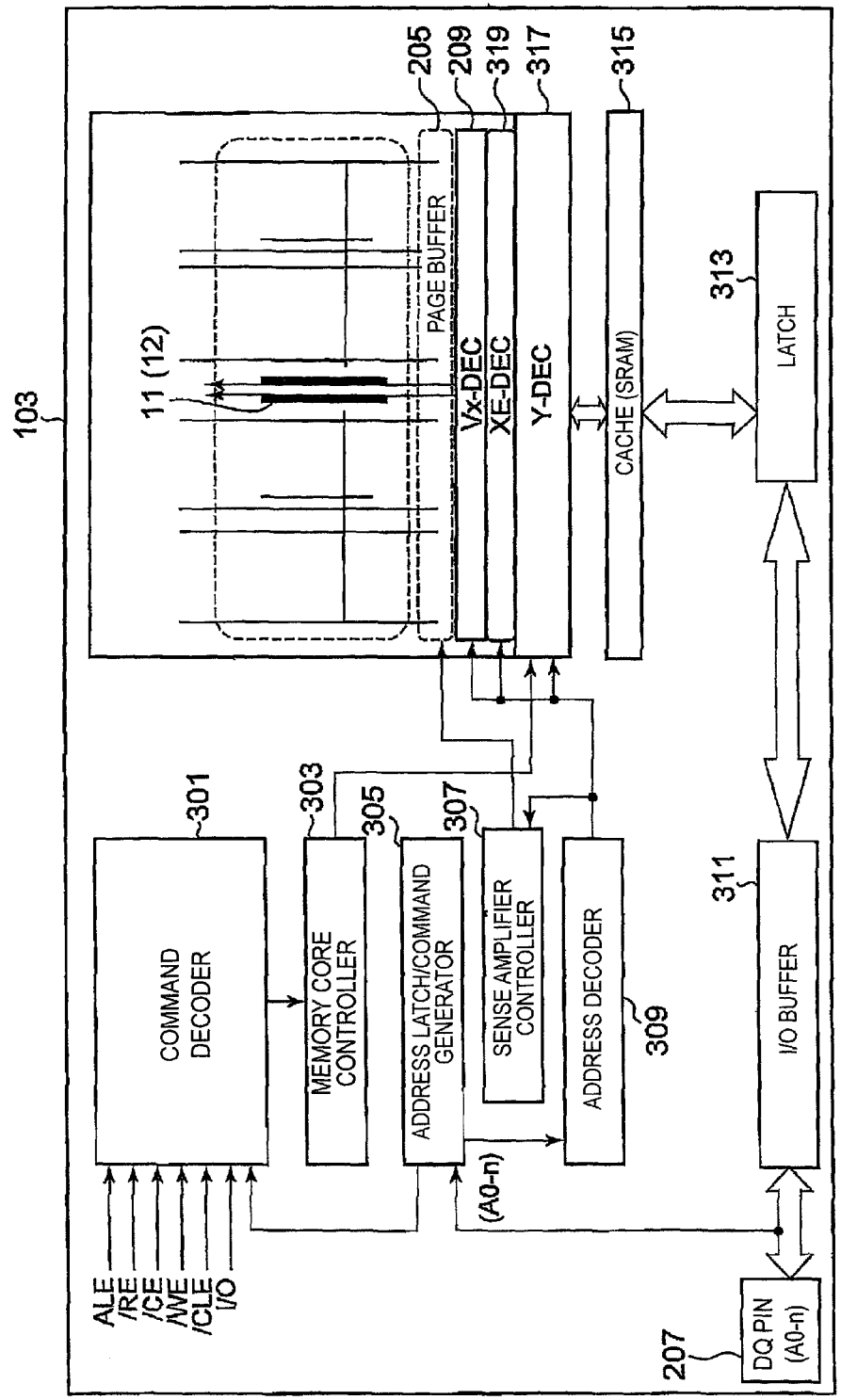
FIG. 5 shows constituent elements included in a flash memory device in detail.

FIG. 5 shows constituent elements included in the flash memory device 103 in detail.

For example, the flash memory device 103 includes a command decoder 301, a memory core controller 303, an address latch/command generator 305, a sense amplifier controller 307, an I/O (Input/Output) buffer 311, a latch 313, a cache area 315, and a Y-DEC 317.

When a /RE (read enable) signal input through a /RE pin (one of the external terminals 207) becomes High (that is, when a read command is input), the command decoder 301 inputs a predetermined signal indicating that event (hereinafter, "read signal") to the memory core controller 303.

When the read signal is input, the memory core controller 303 causes the Y-DEC 317 and the X-DECs 11 and 12 to be in a state for reading data.

Although a DQ pin (one of the external terminals 207) is a pin through which read data (or write data) passes, the word line address signal (a signal indicating a word line designated from the external system 101) also passes through the DQ pin. The word line address signal is stored in the address latch/command generator 305. Alternatively, an address pin (one of the external terminals) can be provided separately, so that the word line address signal passes through the address pin.

The address decoder 309 decodes the word line address signal stored in the address latch/command generator 305. The decoded signal is output to the sense amplifier controller 307, the XE-DEC 319, the Vx-DEC 209, the X-DECs 11 and 12, and the Y-DEC 317.

The sense amplifier controller 307 controls a sense amplifier (not shown) in the page buffer 205 based on the decoded signal from the address decoder 309.

The Y-DEC 317 is a bit line decoder, which selects a bit line based on the decoded signal from the address decoder 309.

The Vx-DEC 209 supplies a voltage signal of a selection level through the Vx line 451 corresponding to a word line selected based on the input decoded signal (GWLS<31:0>).

The X-DEC 11 or 12 selects a word line based on the input decoded signal and a voltage level of a voltage signal that flows through a connected Vx line 451.

According to a bit line and a word line that are selected, data is read from either one of the long string area 201 and the short string area 203. The read data is temporarily stored in the page buffer 205, and then is cached in the cache area (for example, an SRAM (Static Random Access Memory)) 315 from the page buffer 205. The data in the cache area 315 is stored in the I/O buffer 311 through the latch 313. The data in the I/O buffer 311 is then output to the external system 101 through the DQ pin. The data can be read only from a selected page (a page that has been selected) and output to the external system 101. Alternatively, after reading data collectively from a page group including the selected page, the data in the selected page can be extracted from the whole data and output to the external system 101. In the case of writing data, the data is stored in the I/O buffer 311 through the DQ pin, and thereafter it is written in either one of the areas 201 and 203 through the latch 313, the cache area 315, and the page buffer 205.

Figure 6:
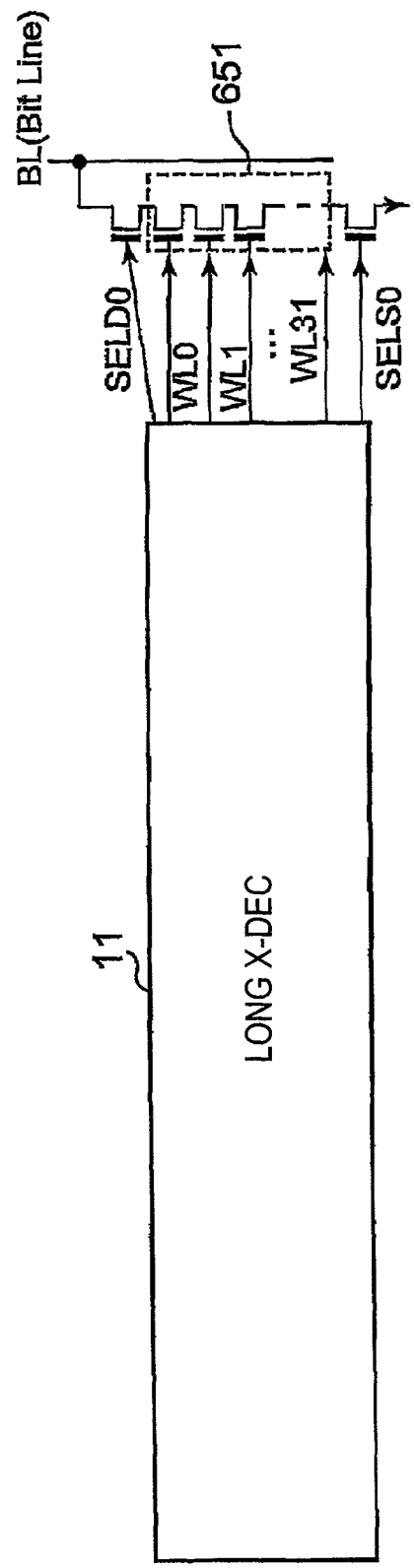
FIG. 6 shows a connection between a long X-DEC and a long string.

FIG. 6 shows a connection between the long X-DEC 11 and the long string.

As shown in FIG. 6, a single long X-DEC 11 is corresponding to each long string 651 that constitutes a single block in the long string area 201 (hereinafter, "target block" in the explanations of FIGS. 6 and 7). Each block in the long string area 201 is constituted by a plurality of long strings 651 arranged in the X direction. As shown in FIG. 6, the long string 651 is constituted by 32 memory cells connected in series.

Figure 7:
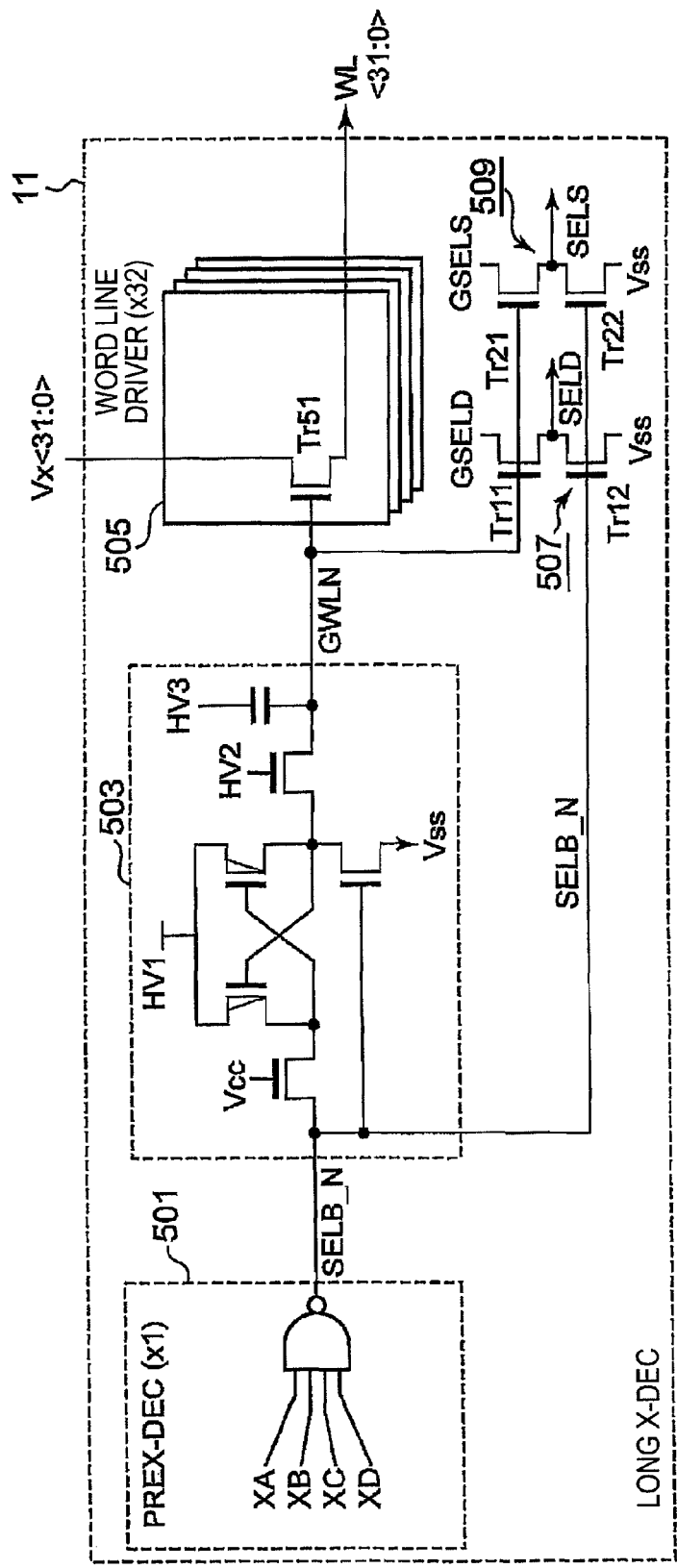
FIG. 7 shows a configuration of the long X-DEC.

FIG. 7 shows a configuration of the long X-DEC 11.

The long X-DEC 11 includes a PREX-DEC 501, an output control circuit 503, 32 WL drivers 505, an SELD control circuit 507, and an SELS control circuit 509.

The PREX-DEC 501 is a logic circuit for switching between selection and non-selection of the target block. The PREX-DEC 501 is, for example, a 4-input NAND circuit. Any one bit of the XA<7:0>, any one bit of the XB<7:0>, any one bit of the XC<7:0>, and any one bit of the XD<3:0> are input to four input pins of the PREX-DEC 501, respectively. Specifically, one of the eight XA lines through which the XA<7:0> flows, one of the eight XB lines through which the XB<7:0> flows, one of the eight XC lines through which the XC<7:0> flows, and one of the four XD lines through which the XD<3:0> flows are connected to the four input pins of the PREX-DEC 501, respectively.

An output signal (SELB_N) from the PREX-DEC 501 is input to the output control circuit 503. The output control circuit 503 includes a level shifter to raise a voltage level of the input SELB_N, and outputs a signal obtained by inverting the voltage level of the SELB_N. That is, when the SELB_N is H (High) level, an output signal (GWLN) of the output control circuit 503 is L (Low) level, and when the SELB_N is L level, the GWLN is H level. The HV1 line, the HV2 line, and the HV3 line are connected to the output control circuit 503.

The WL drivers 505 are control circuits for the word lines. Each of the WL drivers 505 includes a transistor (Tr) 51. One of the 32 Vx lines through which a signal indicating a pVx-th bit of the Vx<31:0> flows is connected to the drain of the Tr 51. One of the 32 word lines (WL<31:0>) common to the target block is connected to the source of the Tr 51. The GWLN is input to the gate of the Tr 51.

The SELD control circuit 507 (SELS control circuit 509) is a circuit that controls whether to supply a voltage supplied through the GSELD (GSELS) to the SELD (SELS). For example, the SELD control circuit 507 (SELS control circuit 509) is constituted by two transistors Tr 11 and Tr 12 (Tr 21 and Tr 22) connected in series. The drain of the Tr 11 (Tr 21) is connected to the GSELD line (GSELS line). The GWLN is input to the gate of the Tr 11 (Tr 21). The source of the Tr 12 (Tr 22) is connected to a Vss terminal from which a voltage signal of a predetermined level (hereinafter, "Vss level") is output. The gate of the Tr 12 (Tr 22) is connected to an output pin of the PREX-DEC 501.

An operation of the long X-DEC 11 is as follows.

That is, during the target block is not selected (when at least one of XA, XB, XC, and XD is "0"), the SELB_N is H level, and the GWLN is L level. As a result, the Tr 11 (Tr 21) is turned OFF and the Tr 12 (Tr 22) is turned ON, so that the voltage signal of the Vss level is supplied to the SELD (SELS) of a string that constitutes the target block.

On the other hand, when the target block is selected (when all of XA, XB, XC, and XD are "1"), the SELB_N is L level, and the GWLN is H level. As a result, the Tr 11 (Tr 21) is turned ON and the Tr 12 (Tr 22) is turned OFF, so that a voltage signal supplied through the GSELD (GSELS) is supplied to the SELD (SELS) of a string that constitutes the target block. In addition, because all the transistors of the 32 WL drivers 505 are turned ON, a voltage signal supplied through the Vx line is supplied to the word line. A voltage signal of the selection level is supplied through a Vx line corresponding to the selection word line among the 32 Vx lines through which the Vx<31:0> flows, while a voltage signal of a non-selection level (a voltage level corresponding to the non-selection) is supplied to the rest of the Vx lines.

Figure 8:
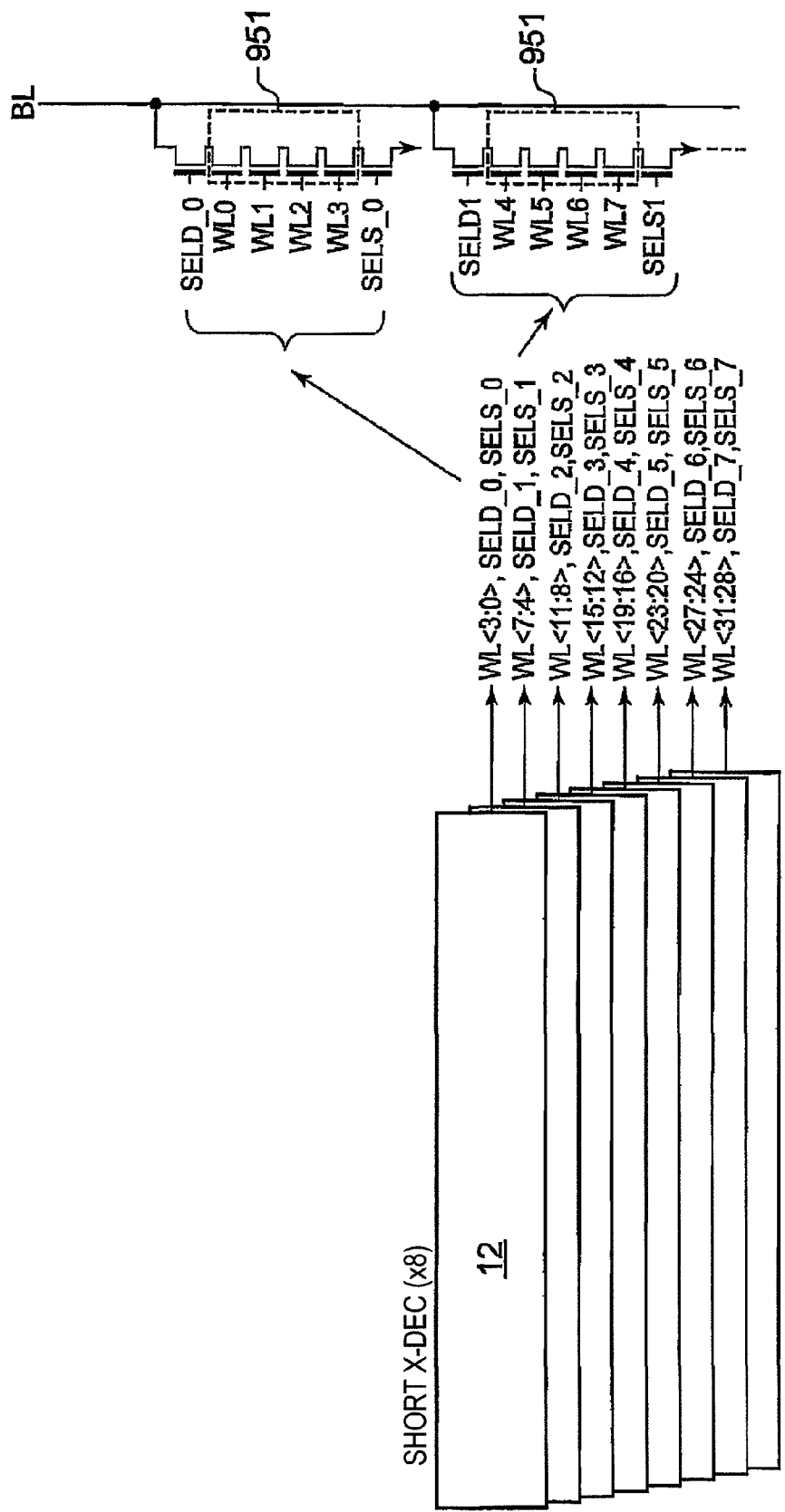
FIG. 8 shows a connection between a short X-DEC and a short string.

FIG. 8 shows a connection between the short X-DEC 12 and the short string.

A single short X-DEC 12 is corresponding to each short string 951 that constitutes a single block in the short string area 203 (hereinafter, "target block" in the explanations of FIGS. 8 and 9). Each block in the short string area 203 is constituted by a plurality of short strings 951 arranged in the X direction. As shown in FIG. 8, the short string 951 is constituted by four memory cells connected in series.

The number of memory cells of the short string 951, which is four, is one eighth of the number of memory cells of the long string 651, which is 32. In the first embodiment, there are eight blocks in the short string area 203 with respect to one block in the long string area 201, and therefore there are eight short X-DECs 12 for one long X-DEC 11.

Figure 9:
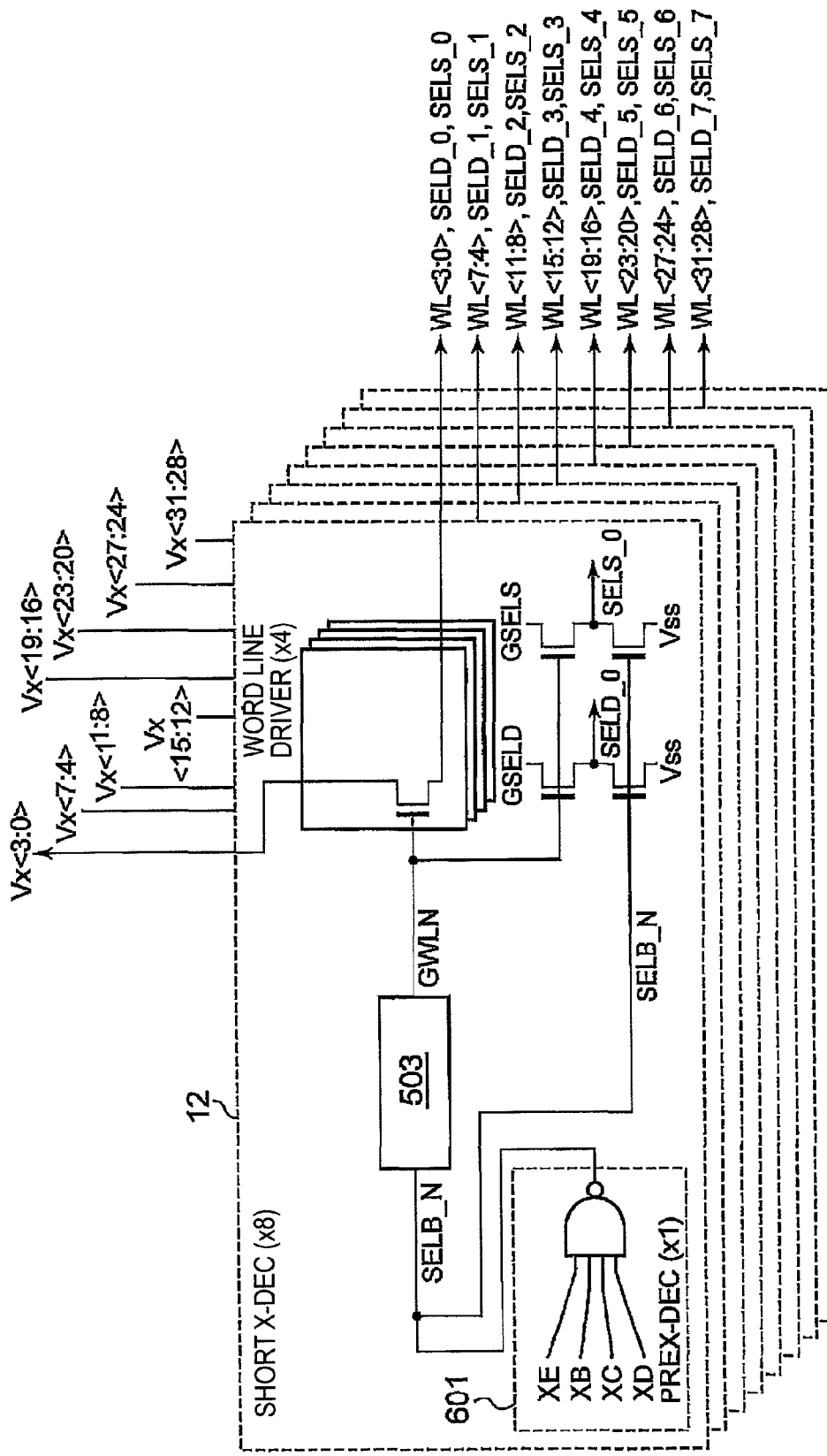
FIG. 9 shows a configuration of the short X-DEC.

FIG. 9 shows a configuration of the short X-DEC 12.

The configuration of a single short X-DEC 12 is the same as that of the long X-DEC 11 except for the number of WL drivers. Therefore, it is possible to configure the short X-DEC 12 based on the configuration of the long X-DEC 11 in a simple manner.

The short X-DEC 12 is explained below focusing on a difference with the long X-DEC 11.

The number of WL drivers is four. It is because the number of word lines common to the target block is four (the number of memory cells of the short string 951 is four). Therefore, the Vx lines connected to a single short X-DEC 12 is four lines among the 32 Vx lines through which the Vx<31:0> flows. In other words, the Vx<31:0> is connected to eight short X-DECs 12, in which every four Vx lines is allocated to each of the short X-DECs 12.

Any one bit of the XB<7:0>, any one bit of the XC<7:0>, and any one bit of the XD<3:0> are input to three input pins among four input pins of a PREX-DEC 601, respectively. Any one bit of the XE<7:0>, not the XA<7:0>, is input to the rest one input pin.

Figure 10:
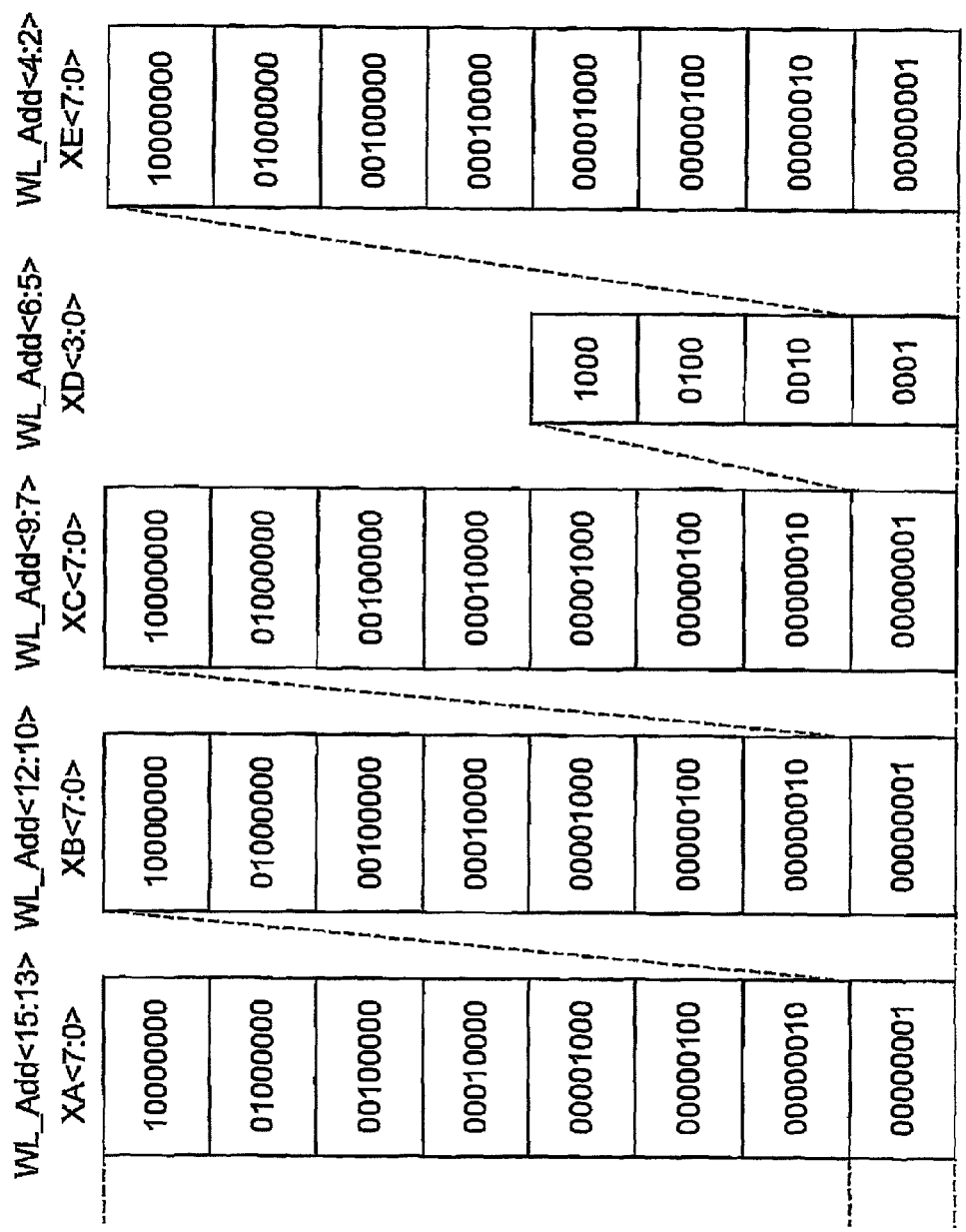
FIG. 10 shows a word-line address map according to the first embodiment.

FIG. 10 shows a word-line address map according to the first embodiment.

As described above, each of the XA<7:0> to XC<7:0> includes 8 bits, the XD<3:0> includes 4 bits, and the XE<7:0> includes 8 bits.

According to this address map, when accessing the long string area 201, the XA<0> is always "0". When the XA<0> is "0", all bits of the XE<7:0> are "0". On the other hand, when accessing the short string area 203, the XA<0> is always "1". Only when the XA<0> is "1", only one bit of the XE<7:0> is "1".

If an area having a memory capacity the same as the total of a memory capacity of the long string area 201 and a memory capacity of the short string area 203 (hereinafter, "whole area") is constituted by 2048 blocks, and if all the 2048 blocks are constituted by a long string of 32 cells, the XE is not necessary. It is because any one of the 2048 blocks can be selected with the XA to XC each having 8 bits and the XD having 4 bits ($\frac{1}{8} \times \frac{1}{8} \times \frac{1}{8} \times \frac{1}{4} = \frac{1}{2048}$).

However, when the whole area is divided into the long string area 201 and the short string area 203, as is the case of the first embodiment, the total number of blocks in the whole area exceeds 2048. It is because the number of memory cells of the short string is ⅛ of the number of memory cells of the long string, and therefore there are eight blocks in the short string area 203 for a capacity of a single block of the long string area 201.

Therefore, with the XA to XC having 8 bits and the XD having 4 bits, it is not possible to select a part of the blocks that constitute the short string area 203.

In order to solve this problem, a method can be considered in which a plurality of X lines following an address map exclusively for the short string area 203 (X lines other than the XA to XD lines) are prepared, a Vx line exclusively for the short string area 203 is prepared, and a block is selected from the short string area 203 by using the prepared X lines and Vx line.

In the first embodiment, instead of adopting the method, a scheme is made for suppressing a design change by using resources for the long string area 201. Examples of the scheme is as follows.

(Scheme 1) The Vx<31:0> is common to the areas 201 and 203. The Vx<31:0> is connected to the eight short X-DECs 12, in which every four lines is allocated to each of the short X-DECs 12.

(Scheme 2) Simply by adding eight XE lines (8-bit XE (XE<7:0>)) any block can be selected from the areas 201 and 203. The XB line, the XC line, and the XD line are common to the areas 201 and 203, and only when accessing the short string area 203, the XA<0> becomes "1" and only one bit of the XE<7:0> becomes "1".

In the XA<7:0>, the reason why the number of bits that becomes "1" (hereinafter, "special bit") is one exclusively when accessing the short string area 203 is because ⅛ of the whole area (that is, the area constituted by the areas 201 and 203) is the short string area 203. That is, the number of special bits is different according to a proportion of the short string area 203 to the whole area. For example, if ¼ of the whole area is the short string area 203, the number of special bits is two (for example, XA<1> and XA<0> are the special bits).

Furthermore, it is preferable that the number of memory cells of the short string N, where N is an integer equal to or larger than 1, be a submultiple of the number of memory cells of the long string L, where L is an integer equal to or larger than 2, and L is larger than N.

The word-line address map is different according to the number of blocks existing in the whole area. Therefore, for example, the number of X lines common to the areas 201 and 203 is different according to the number of blocks that constitute the whole area.

A configuration of the XE-DEC 319 is explained below with an assumption that the special bit (a bit that becomes "1" exclusively when accessing the short string area 203) is the XA<0> only.

The XE-DEC 319 is configured to generate and output the XE<7:0> with all the bits "0" when the XA<0> is "0" and to generate and output the XE<7:0> with only one bit "1" when the XA<0> is "1".

Figure 11:
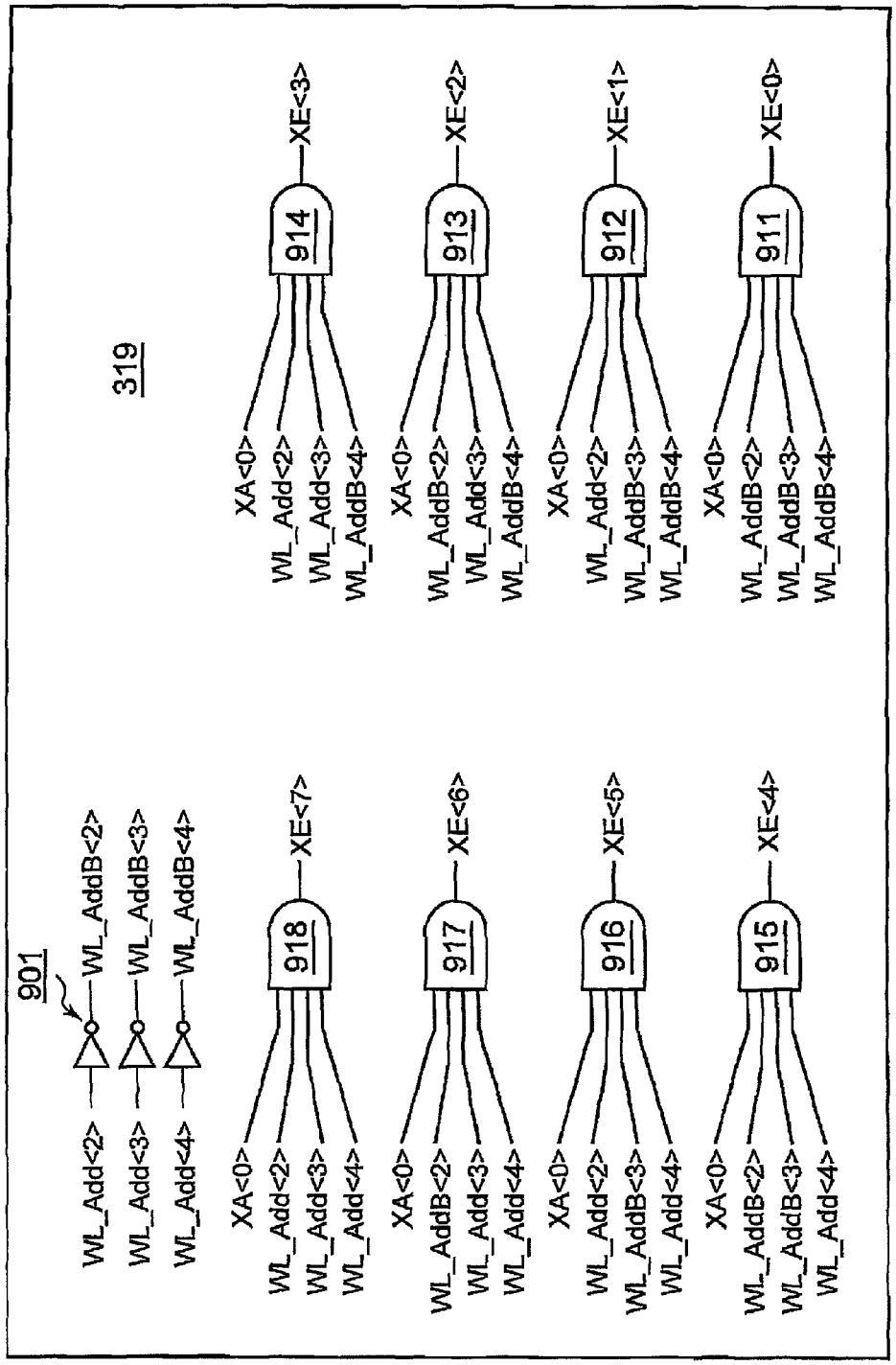
FIG. 11 shows a configuration of an XE-DEC.

FIG. 11 shows a configuration of the XE-DEC 319.

The XE-DEC 319 includes a NOT circuit group 901 including three NOT circuits that invert three bits constituting the WL_Add<4:2>, respectively. Signals obtained by inverting WL_Add<2>, WL_Add<3>, and WL_Add<4> are represented by WL_AddB<2>, WL_AddB<3>, and WL_AddB<4>, respectively.

The XE-DEC 319 further includes eight AND circuits 911 to 918 that output eight bits that constitute the XE<7:0>, respectively. Each of the AND circuits 911 to 918 includes four input pins. The XA<0> is input to any one of the input pins, and at least one of at least one bit of the WL_Add<4:2> and/or at least one bit of WL_AddB<4:2> is input to the rest of the input pins.

FIG. 12 shows a truth table of the XE-DEC 319.

A result shown in the truth table of FIG. 12 is obtained from the configuration shown in FIG. 11. That is, all the bits of the XE<7:0> becomes "0" when the XA<0> is "0", and only one bit of the XE<7:0> becomes "1" when the XA<0> is "1".

For example, an arrangement of the XE-DEC 319 can be considered as follows.

(First arrangement) The XE-DEC 319 is arranged on the −Y direction side from the short X-DECs 12 arranged in the Y direction (for example, near (adjacent to) the Vx DEC 209 and on the −Y direction side from the Vx-DEC 209). In this case, eight XE lines are extending in the +Y direction from the XE-DEC 319 and allocated to the short X-DECs 12. This first arrangement can be adopted, for example, when there is no empty area for arranging the XE-DEC 319 in the short X-DEC 12 (for example, near the PREX-DEC 601).

(Second arrangement) The XE-DEC 319 is arranged in each of the short X-DECs 12. In this case, three X lines through which the WL_Add<4:2> flows are extending in the +Y direction and allocated to the short X-DECs 12. That is, it is possible to reduce the number of lines that should be extended in the +Y direction compared to the first arrangement. This second arrangement can be adopted, for example, when there is an empty area for arranging the XE-DEC 319 in the short X-DEC 12 (for example, near the PREX-DEC 601).

The Vx-DEC 209 is explained below.

The Vx-DEC 209 includes a Vx sub-DEC for each Vx line. Therefore, the Vx-DEC 209 includes 32 Vx sub-DECs corresponding to the 32 Vx lines, respectively. By controlling the Vx sub-DECs, levels of voltages supplied through the Vx lines respectively corresponding to the Vx sub-DECs are controlled.

Figure 13:
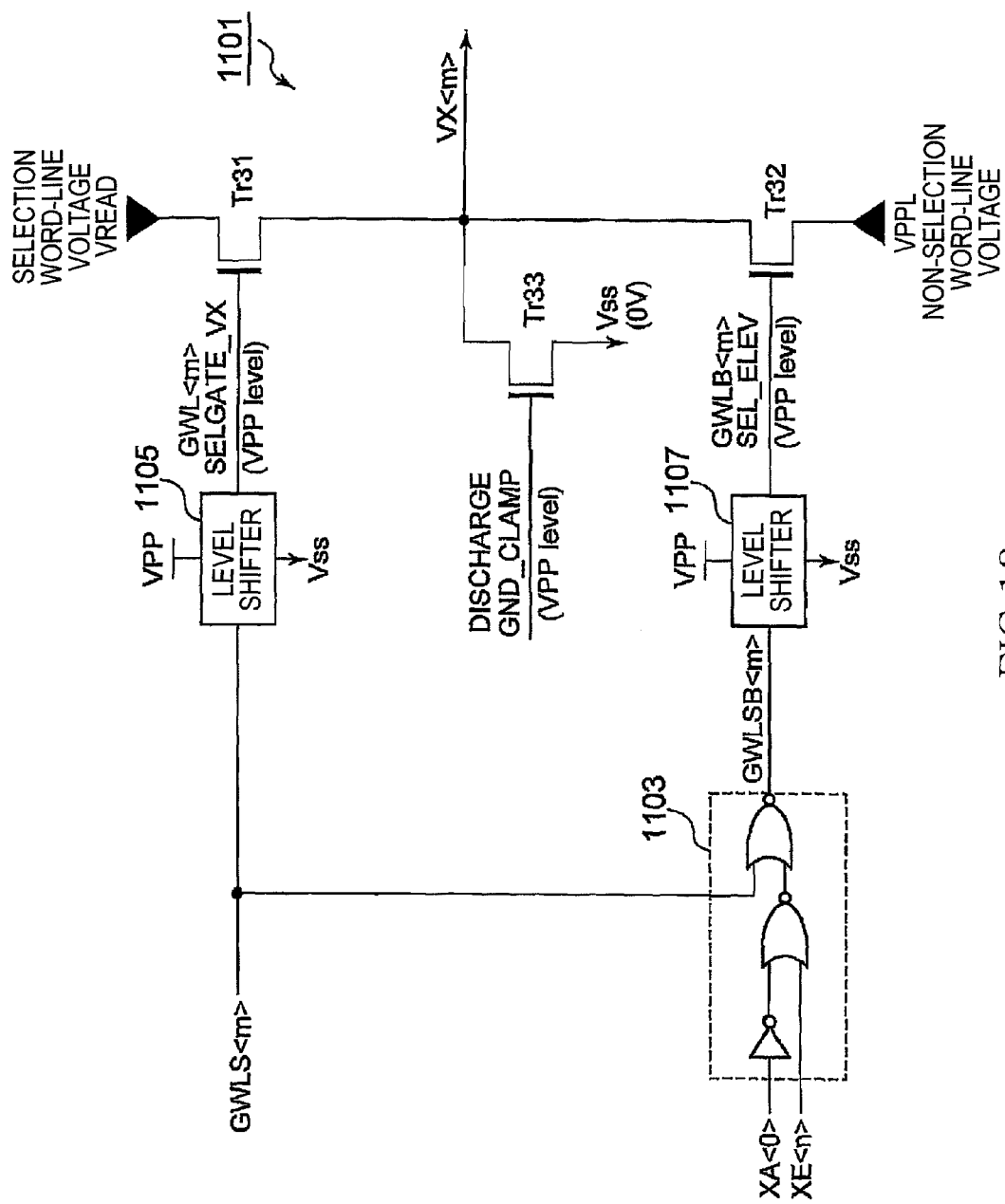
FIG. 13 shows a configuration of a single Vx sub-DEC that constitutes a Vx-DEC, in which "m" is an integer equal to or larger than 0 and equal to or smaller than 31.

FIG. 13 shows a configuration of a single Vx sub-DEC that constitutes the Vx-DEC 209 (in FIG. 13, "m" is an integer not less than 0 and not more than 31).

The Vx sub-DEC is corresponding to Vx<m>. GWLS<m> (one bit of the GWLS<31:0>), XA<0>, and XE<n>, where n is an integer not less than 0 and not more than 7, are input to a Vx sub-DEC 1101. A relation between n and m can be, for example, m=n+8a, where "a" is a coefficient that is an integer not less than 0 and not more than 3. The coefficient "a" is a quotient obtained by dividing the number of memory cells of the long string by the number of memory cells of the short string, which is eight in the first embodiment.

The Vx sub-DEC 1101 includes transistors Tr 31 and Tr 32 connected in series, a transistor Tr 33 for discharge, level shifters 1105 and 1107, and a Tr control circuit 1103. A selection WL voltage signal (selection word-line voltage signal) is supplied through the drain of the Tr 31, and a non-selection WL voltage signal is supplied through the source of the Tr 32.

A GWLS<m> is input to the gate of the Tr 31 through the level shifter 1105. If the Vx line through which the Vx<m> flows is a Vx line of the selection word line, the GWLS<m> is H level, and if the Vx line through which the Vx<m> flows is a Vx line of the non-selection word line, the GWLS<m> is L level.

The Tr control circuit 1103 is a circuit that controls a level of a signal GWLSB<m> that is input to the gate of the Tr 32 through the level shifter 1107. The Tr control circuit 1103 is a set of logic circuits, to which GWLS<m>, the XA<0>, and the XE<n> are input and from which the GWLSB<m> is output.

FIG. 14 shows a truth table of the Vx sub-DEC shown in FIG. 13.

A result shown in the truth table of FIG. 14 is obtained from the configuration of the Vx sub-DEC 1101 shown in FIG. 13.

As shown in FIGS. 13 and 14, a result as described below is obtained.

(Case 1) When the Vx line through which the Vx<m> flows is corresponding to the non-selection word line upon accessing the long string area 201, the XA<O>, the XE<n>, and the GWLS<m> becomes "0", so that the GWLSB<m> becomes "0". Therefore, the Tr 31 is turned OFF and the Tr 32 is turned ON, by which the non-selection WL voltage signal is supplied as the Vx<m>.

(Case 2) When the Vx line through which the Vx<m> flows is corresponding to the selection word line upon accessing the long string area 201, the XA<0>, the XE<n>, and the GWLSB<m> becomes "0", so that the GWLS<m> becomes "0". Therefore, the Tr 31 is turned ON and the Tr 32 is turned OFF, by which the selection WL voltage signal is supplied as the Vx<m>.

(Case 3) When the Vx line through which the Vx<m> flows is connected to the short X-DEC 12 corresponding to the non-selection block upon accessing the short string area 203, the XE<n>, the GWLS<m>, and the GWLSB<m> becomes "0" while the XA<1> is "1". Therefore, both the Tr 31 and Tr 32 are turned OFF, by which the Vx<m> becomes floating.

(Case 4) When the Vx line through which the Vx<m> flows is connected to the non-selection word line in a selected block upon accessing the short string area 203, the XA<1>, the XE<n>, and the GWLSB<m> becomes "1", and the GWLS<m> becomes "0". Therefore, the Tr 31 is turned OFF and the Tr 32 is turned ON, by which the non-selection WL voltage signal is supplied as the Vx<m>.

(Case 5) When the Vx line through which the Vx<m> flows is connected to the selection word line in a selected block upon accessing the short string area 203, the XA<1>, the XE<n>, and the GWLS<m> becomes "1", and the GWLSB<m> becomes "0". Therefore, the Tr 31 is turned ON and the Tr 32 is turned OFF, by which the selection WL voltage signal is supplied as the Vx<m>.

In the Case 3, the Vx<m> can be set to a Vss (0 volt (V)) instead of becoming floating. As a method to implement this, for example, an adoption of a configuration shown in FIG. 15 as the configuration of the Vx sub-DEC can be considered.

Figure 15:
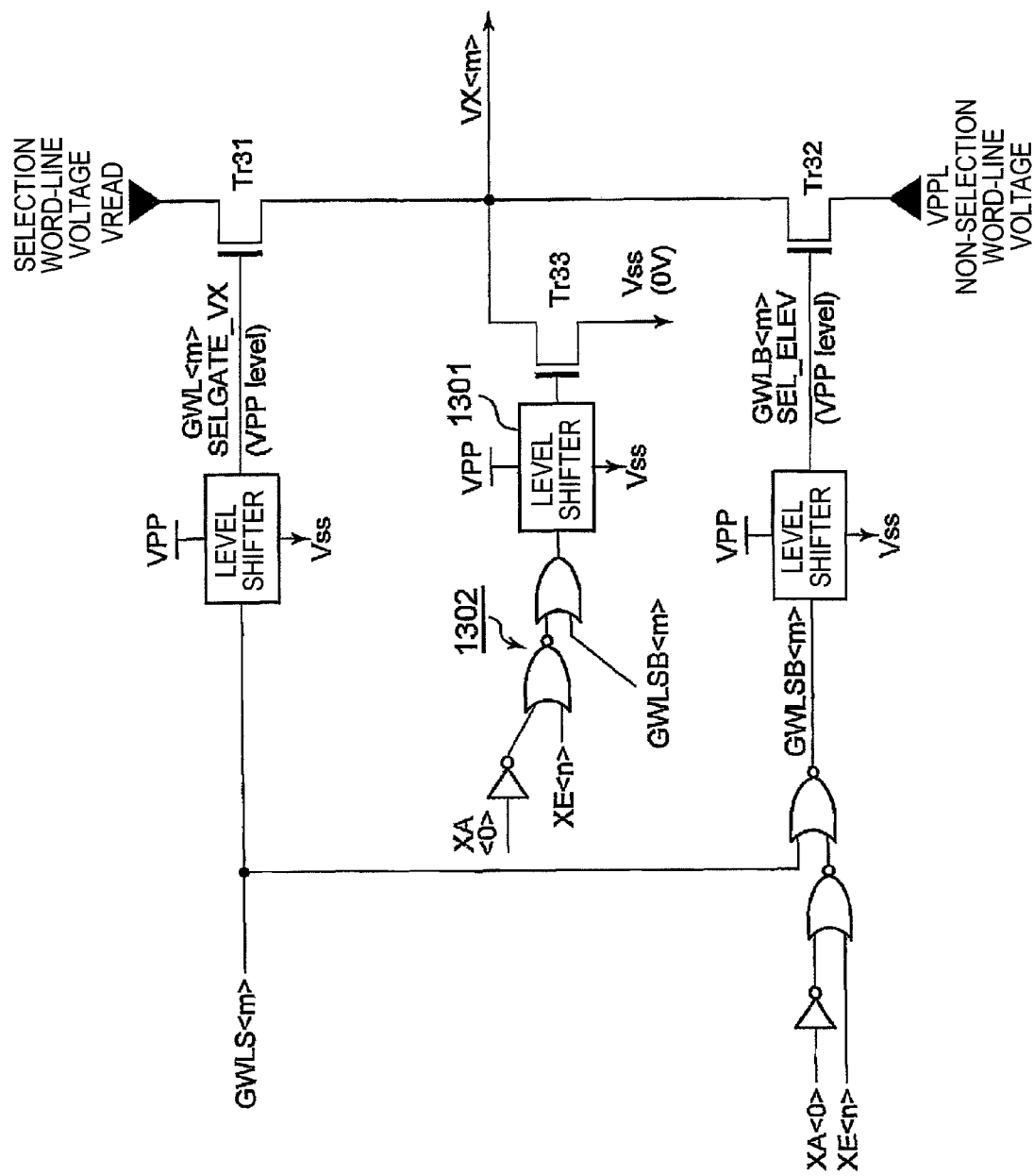
FIG. 15 shows a configuration of a modification of the Vx sub-DEC.

FIG. 15 shows a configuration of a modification of the Vx sub-DEC corresponding to the Vx<m>.

That is, a discharge control logic circuit 1302 is connected to the gate of a Tr 33 of which the source is grounded to the Vss (0 V), through a level shifter 1301. The XA<1>, the XE<n>, and the GWLSB<m> are input to the discharge control logic circuit 1302. The discharge control logic circuit 1302 is configured to output a signal of H level ("1") when the XA<1> is "1" and the XE<n> and the GWLSB<m> are "0". Therefore, in the Case 3, the Tr 33 is turned ON, by which the Vx<m> becomes a voltage signal of 0 V.

The Vx lines can be laid out such that a voltage signal supplied through one of two Vx lines that are adjacent to each other always becomes a voltage signal of 0 V. That is, a non-used Vx line can be used as a substitute for a shield line.

The first embodiment is as explained above. In the first embodiment, when three or more memory cell arrays (core arrays) are arranged as shown in FIG. 3E, an area from which a block is to be selected can be represented by a portion of particular two bits or more in the decoded signal of the word line address.

[Second Embodiment]

The second embodiment of the present invention is explained below. In the following descriptions, differences between the first embodiment and the second embodiment are mainly explained, and descriptions of common characteristics between these embodiments will be omitted or abbreviated.

Figure 16:
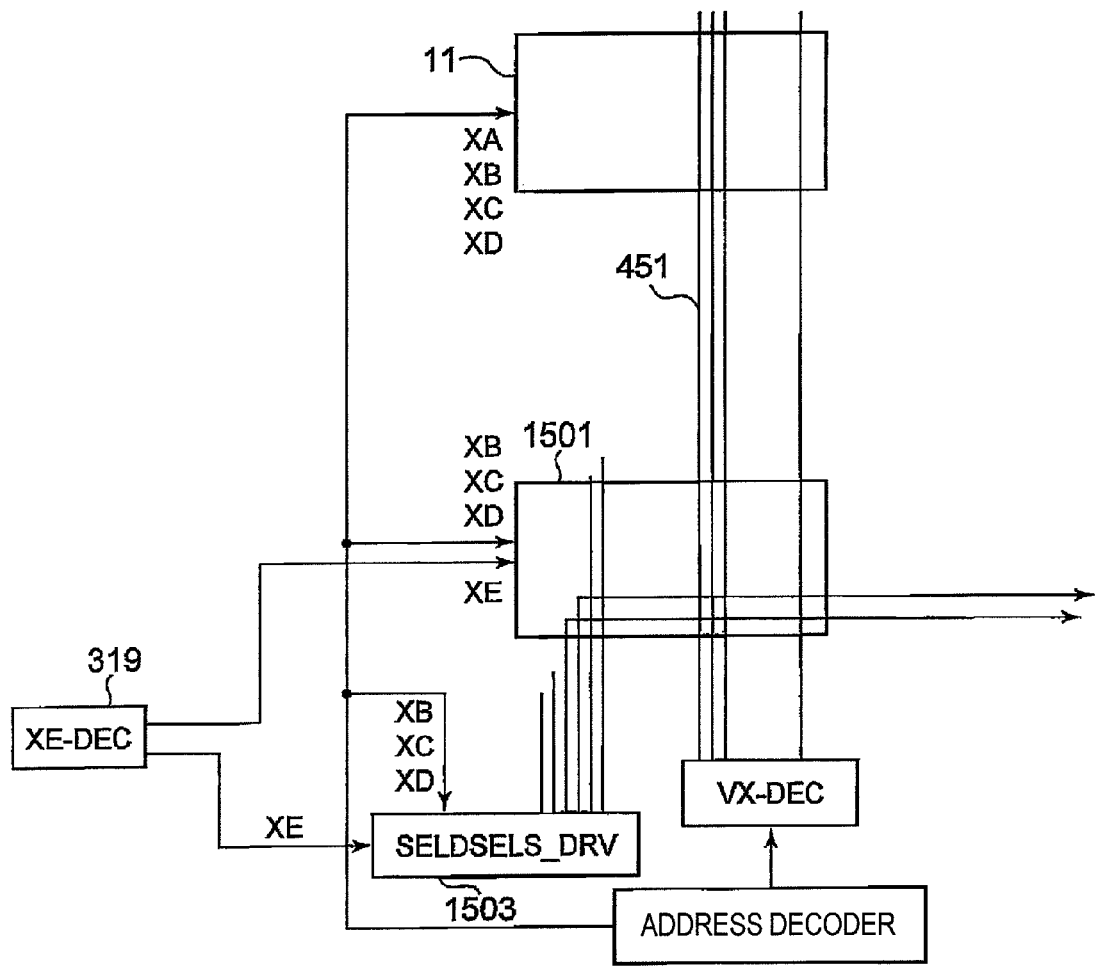
FIG. 16 shows a wiring relevant to a long X-DEC and a short X-DEC according to a second embodiment of the present invention.

FIG. 16 shows a wiring relevant to a long X-DEC and a short X-DEC according to the second embodiment.

A single short X-DEC 1501 is shared by eight blocks in the short string area 203. That is, the short X-DEC 1501 is provided for every eight blocks in the short string area 203. The 32 Vx lines 451 through which the Vx<31:0> flows are connected to each short X-DEC 1501. When a block in the short string area 203 is selected, only a Vx supplied through four Vx lines corresponding to four word lines common to the selected block becomes the selection WL voltage signal.

In the second embodiment, it is possible to have an occupation area of the short X-DECs 1501 arranged in the Y direction smaller than that of the short X-DECs 12 arrange in the Y direction in the first embodiment.

Eight SELDSELS_DRVs 1503 are further included. The figure "8" is a quotient obtained by dividing the number of memory cells 32 of the long string by the number of memory cells 4 of the short string. The eight SELDSELS_DRVs 1503 are common to all the short X-DECs 1501.

Each of the SELDSELS_DRVs 1503 is a driver (circuit) that controls whether to supply a voltage signal supplied through the GSELD line (GSELS line) to the SELD (SELS) in its corresponding block. When its corresponding block is selected, each of the SELDSELS_DRVs 1503 supplies the voltage signal supplied through the GSELD line (GSELS line) to the SELD (SELS) that constitutes the block. Any one of the XB<7:0>, any one of the XC<7:0>, any one of the XD<3:0>, and any one of the XE<7:0> are connected to inputs of each of the SELDSELS_DRVs 1503. In the second embodiment, the SELDSELS_DRVs 1503 are arranged in the −Y direction from the short X-DECs 1501. A line from each of the SELDSELS_DRVs 1503 to the SELD (SELS) is extending from the SELDSELS_DRV 1503 in the +Y direction, extending in the +X direction (or the −X direction) by being routed through the short X-DEC 1501 corresponding to the SELDSELS_DRV 1503, and connected to the SELD and the SELS. Alternatively, the eight SELDSELS_DRVs 1503 can be arranged in or near the short X-DECs 1501. In this case, it is possible to eliminate the necessity of extending the lines from the SELDSELS_DRVs 1503 to the short X-DECs 1501.

Figure 17:
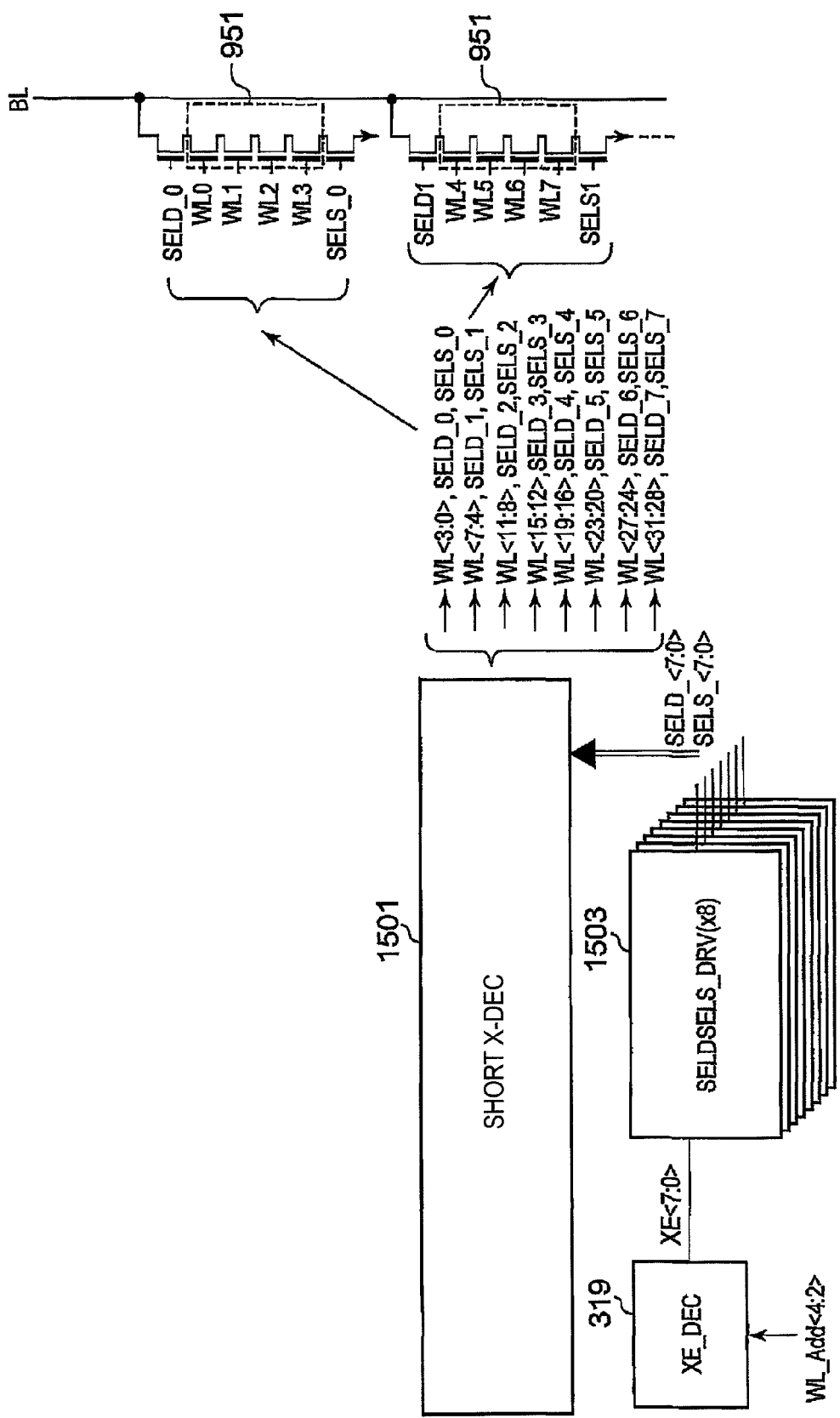
FIG. 17 shows a connection between a short X-DEC and a short string.

FIG. 17 shows a connection between the short X-DEC 1501 and the short string.

As described above, a single short X-DEC 1501 is shared by eight blocks. Because four word lines are common to a single block, 32 word lines (four word lines×eight blocks) are connected to the short X-DEC 1501.

Figure 18:
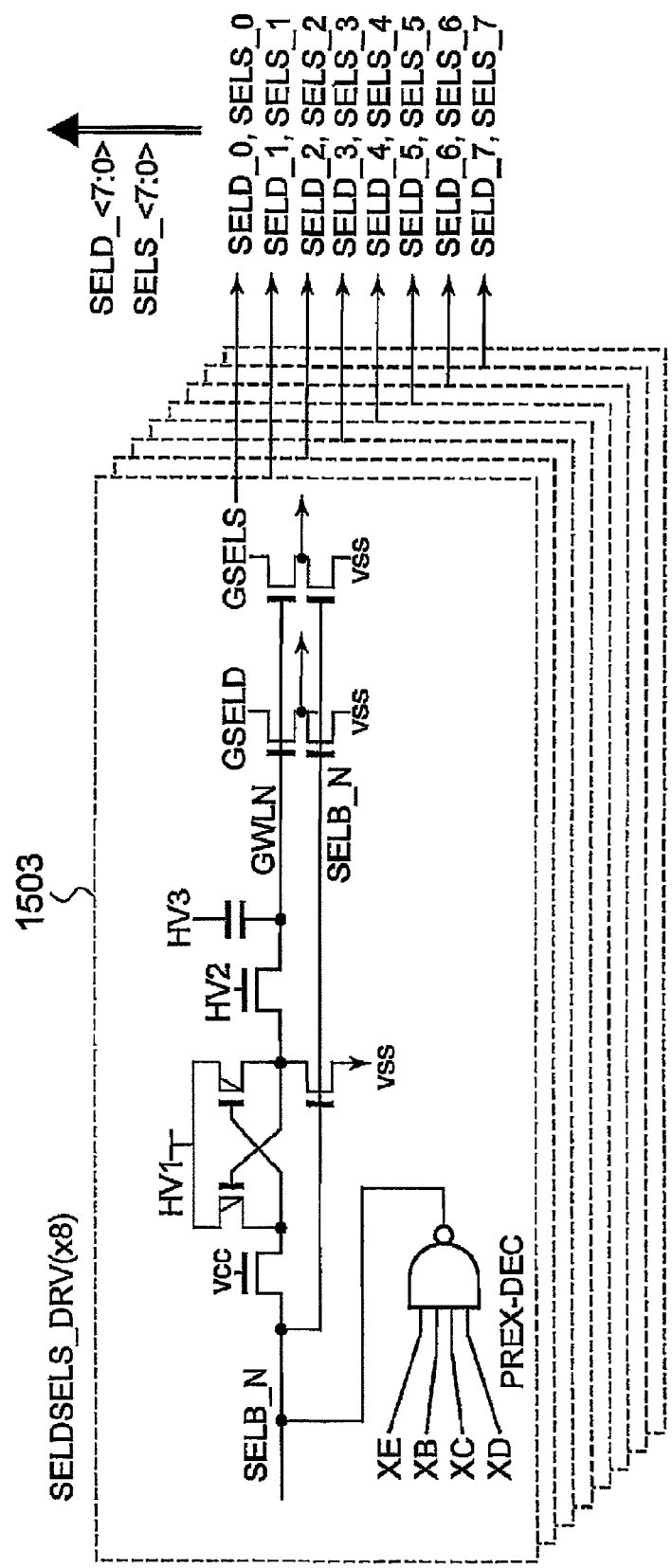
FIG. 18 shows a configuration of SELDSELS_DRVs.

FIG. 18 shows a configuration of the SELDSELS_DRVs 1503.

As described above, the eight SELDSELS_DRVs 1503 are shared by the short X-DECs 1501 arranged in the Y direction, being arranged in the −Y direction from the shorts X-DEC 1501. Therefore, the eight SELD lines (SELD<7:0>) and the eight SELS lines (SELS<7:0>) extending from the eight SELDSELS_DRVs 1503 are extended in the +Y direction. The SELD line is a signal line connected to the SELD, and the SELS line is a signal line connected to the SELS. If the eight SELDSELS_DRVs 1503 are arranged in each of the short X-DEC 1501, it is not necessary to extend the SELD<7:0> and the SELS<7:0> in the +Y direction.

The configuration of the SELDSELS_DRVs 1503 is substantially the same as the configuration of the short X-DEC 12 with the eight WL drivers excluded. That is, each of the SELDSELS_DRVs 1503 supplies the voltage signal supplied through the GSELD (GSELS) in response to the input signals XB, XC, XD, and XE.

Although the SELD and the SELS are controlled by the common SELDSELS_DRV 1503, drivers for controlling the SELD and the SELS can be provided separately from each other. In this case, because it is possible to make a fine adjustment of timings of the SELD and the SELS, it can be expected to contribute to a high-speed read operation. In addition, the separate arrangements of the drivers for controlling the SELD and the SELS can be applied to at least one of the long X-DEC 11 and the short X-DEC 12.

[Third Embodiment]

In the first and second embodiments, any one of the XE<7:0> becomes "1" only when the decoded signal of the word line address XA<0> is "1", by which a block is selected from the short string area 203. That is, in the first and second embodiments, an area from which a block is selected is determined between the areas 201 and 203 by the word line address supplied from the external system 101.

In the third embodiment, a signal line (AS line) is provided through which an area selection signal (AS signal) flows. The AS indicates the area from which a block is selected between the areas 201 and 203. With this configuration, there are seven XA lines (XA<6:0>) in the third embodiment.

Figure 19:
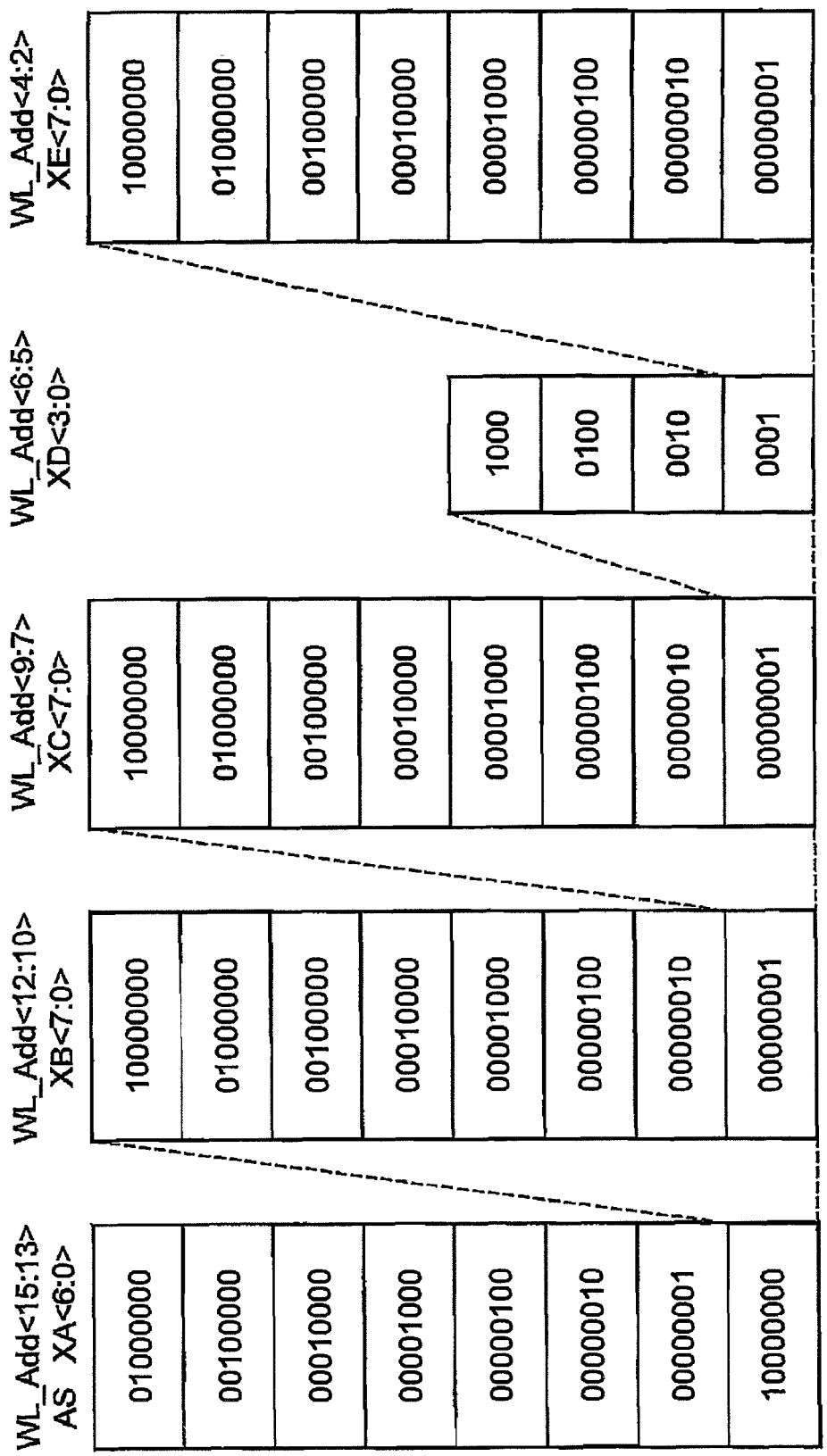
FIG. 19 shows a relation between a word-line address map according to a third embodiment of the present invention and a signal level of an AS signal.

FIG. 19 shows a relation between a word-line address map according to the third embodiment and a signal level of the AS.

In the third embodiment, the short string area 203 is also ⅛ of the whole area. Accordingly, when the WL_Add<15:13> is <1,1,1>, there exists no address space. Therefore, the AS line is provided instead of the X line of an XA<7>.

When the AS is "0", a block is selected from the long string area 201. When the AS is "0", any one bit of each of the XA<6:0>, the XB<7:0>, the XC<7:0>, and the XD<3:0> becomes "1", and all bits that constitute the XE<7:0> become "0".

On the other hand, when the AS is "1", a block is selected from the short string area 203. When the AS is "1", all bits that constitute the XA<6:0> become "0", and any one bit of each of the XE<7:0>, the XC<7:0>, the XD<3:0>, and the XE<7:0> becomes "1".

That is, in the third embodiment, the special bit explained in the first embodiment (a bit that becomes "1" exclusively when accessing the short string area 203) is not the XA<0> but the AS. Therefore, the number of As lines is different according to a proportion of the short string area 203 to the whole area. For example, if ¼ of the whole area is the short string area 203, the number of AS lines is two.

The number of special bits (the number of lines through which the special bits flow) is not necessarily to be determined based on the proportion of the short string area 203 to the whole area.

Figure 20:
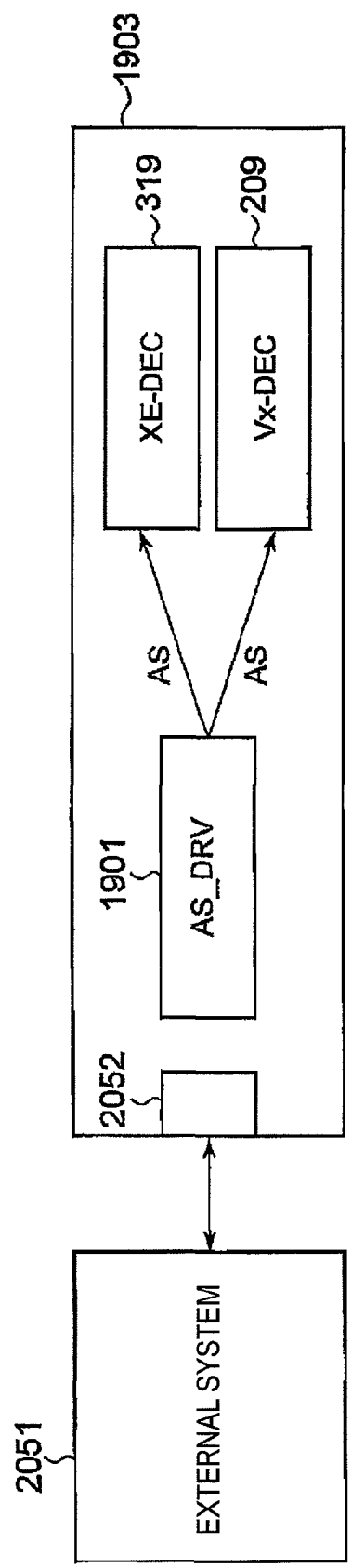
FIG. 20 shows a flash memory system according to the third embodiment.

FIG. 20 shows a flash memory system according to the third embodiment.

In the third embodiment, the signal level of the AS is switched based on whether a predetermined external terminal is detected at the time of an access command. For example, as shown in FIG. 20, a flash memory device 1903 includes an AS_DRV 1901 that is a circuit for switching the signal level of the AS. The AS line is connected to the XE-DEC 319 instead of the XA<0>. Furthermore, the AS line is connected to the Vx DEC 209 instead of the XA<0>. Although the value of the AS is controlled by the AS_DRV in the third embodiment and fourth to sixth embodiments, the function of the AS_DRV can be incorporated in any one of existing circuits. In this case, the AS line can be arranged in the existing circuit.

In the third embodiment, the AS_DRV 1901 switches the signal level of the AS based on whether an external terminal detected among a plurality of external terminals connected to an external system 2051 is a predetermined external terminal 2052. For example, the external system 2051 changes a level of a signal output from the predetermined external terminal 2052 among a plurality of external terminals in order to read data from the short string area 203 (for example, changes the level of the signal from H level to L level).

Figure 21:
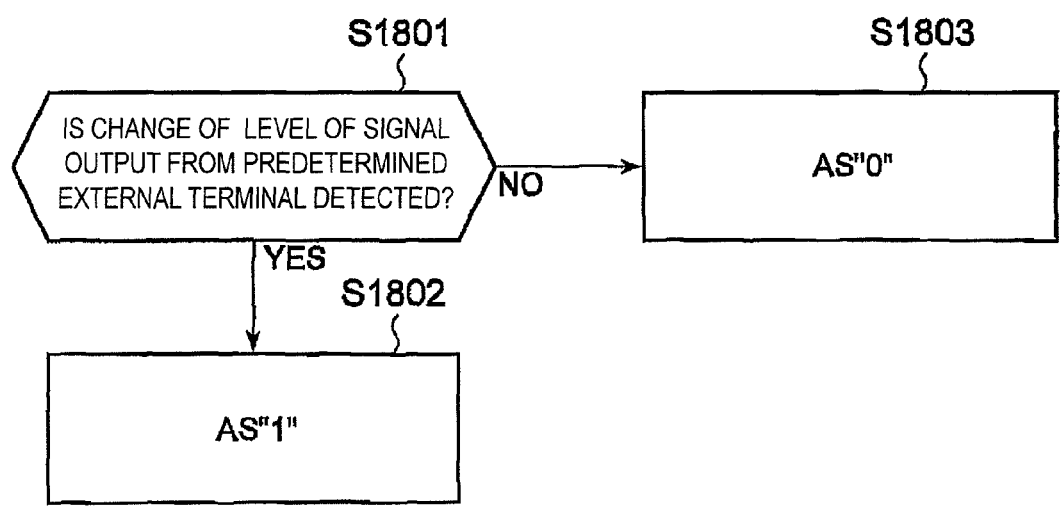
FIG. 21 is a flowchart of an AS switching process according to the third embodiment.

FIG. 21 is a flowchart of an AS switching process according to the third embodiment.

As shown in FIG. 21, when a change of the level of the signal output from the predetermined external terminal 2052 is detected (for example, an access command is received from the predetermined external terminal 2052) (Step S1801: YES), the AS_DRV 1901 outputs the AS "1" (Step S1802). When the AS "1" is output, data is read from the short string area 203 and output to the external system 2051. On the other hand, when such a change is not detected (Step S1801: NO), the AS_DRV 1901 outputs the AS "0" (Step S1803). When the AS "0" is output, data is read from the long string area 201 and output to the external system 2051.

For example, a specific example of the AS switching process is as follows.

When it is detected that a signal level of a first external terminal (for example, a CS0 terminal) reaches a predetermined level (for example, L level) (for example, when it is detected Th$_1$ times, where Th$_1$ is a natural number), the AS becomes "1". When it is detected that a signal level of a second external terminal (for example, a CS1 terminal) reaches a predetermined level (for example, L level) (for example, when it is detected Th$_2$ times, where Th$_2$ is a natural number), the AS becomes "0".

When booting the external system, control data is read by the external system for the purpose of a system check and the like. If it is detected that a signal level of a specific external terminal is changed when booting the external system (for example, when it is detected Th$_3$ times, where Th$_3$ is a natural number), the AS becomes "1", and otherwise, the AS becomes "0". The specific external terminal can be at least one of an RE toggle (read toggle) terminal, an RDY/BSY terminal, and a CE terminal.

The third embodiment is as explained above. When three or more areas (memory cell arrays) are arranged, for example, as shown in FIG. 3E, the AS can be represented by two bits or more. For example, when it is determined that a signal level of a third external terminal different from the first and second external terminal reaches a predetermined level (for example, L level), the AS of two bits or more can be a value corresponding to the middle string area. In this case, data is read from the middle string area.

[Fourth Embodiment]

Figure 22:
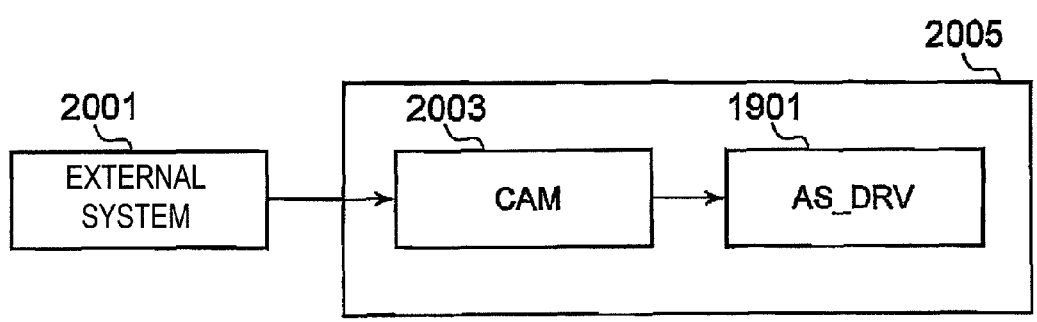
FIG. 22 shows a flash memory system according to a fourth embodiment.

FIG. 22 shows a flash memory system according to the fourth embodiment.

In the fourth embodiment, an area from which a block is selected is determined between the areas 201 and 203 based on a value of the AS. In the fourth embodiment, as shown in FIG. 22, a flash memory device 2005 includes a nonvolatile memory area (hereinafter, "CAM") 2003 that is different from the areas 201 and 203. The value of the AS is controlled based on information stored in the CAM 2003 (hereinafter, "control information"). For example, as shown in FIG. 22, the control information in the CAM 2003 is rewritten by a command from an external system 2001.

Figure 23:
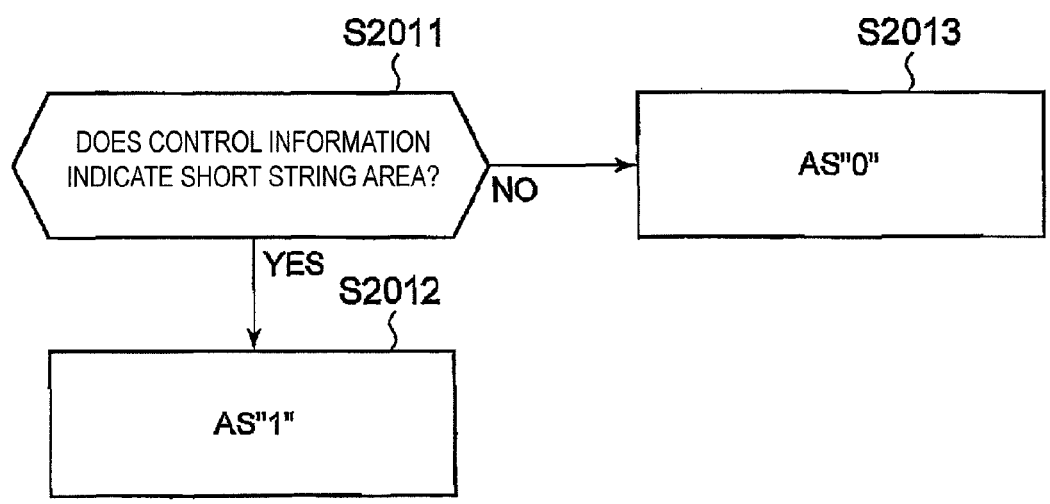
FIG. 23 is a flowchart of an AS switching process according to the fourth embodiment.

FIG. 23 is a flowchart of an AS switching process according to the fourth embodiment.

When the control information indicates the short string area 203 (Step S2011: YES), an AS_DRV 1901 outputs the AS "1" (Step S2012). On the other hand, when the control information indicates the long string area 201 (Step S2011: NO), the AS_DRV 1901 outputs the AS "0" (Step S2013).

For example, the control information can indicate the short string area by default. Alternatively, the external system 2001 can rewrite the control information in the CAM 2003 to indicate the short string area when it is booted. Upon reading data for Th$_4$ times, where Th$_4$ is a natural number, after the external system 2001 is booted, for example, the external system 2001 can rewrite the control information in the CAM 2003 to indicate the long string area.

The fourth embodiment is as explained above. When three or more areas (memory cell arrays) are arranged, for example, as shown in FIG. 3E, the external system 2001 rewrite the control information in the CAM 2003 to indicate an area selected from the three or more areas.

Although the control information is stored in the nonvolatile memory area, it can be alternatively stored in a volatile memory area.

[Fifth Embodiment]

Figure 24:
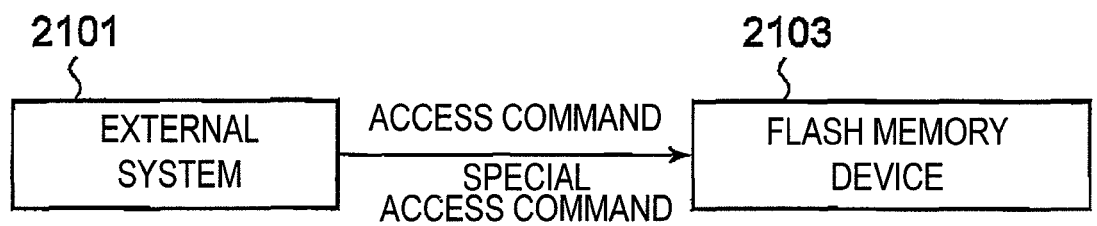
FIG. 24 shows a flash memory system according to a fifth embodiment.

FIG. 24 shows a flash memory system according to the fifth embodiment.

In the fifth embodiment, an area from which a block is selected is determined between the areas 201 and 203 based on a value of the AS. In the fifth embodiment, the value of the AS is controlled based on whether a command from an external system is a special command. As shown in FIG. 24, an external system 2101 controls a transmission of either one of a special access command and a non-special access command to a flash memory device 2103 based on the access to either one of the areas 201 and 203.

Figure 25:
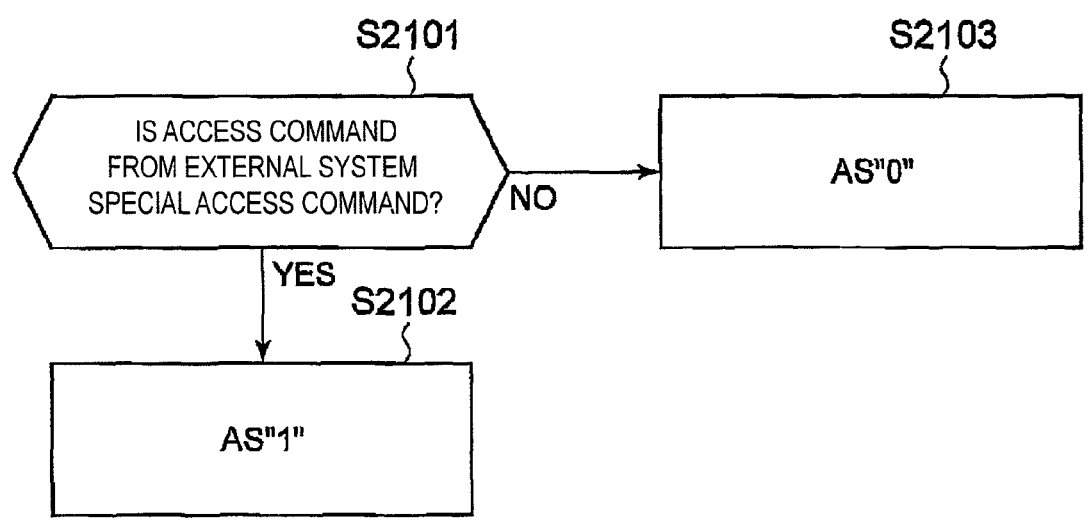
FIG. 25 is a flowchart of an AS switching process according to the fifth embodiment.

FIG. 25 is a flowchart of an AS switching process according to the fifth embodiment.

As shown in FIG. 25, when an access command from the external system 2101 is the special access command (Step S2101: YES), the AS_DRV outputs the AS "1" (Step S2102). On the other hand, when the access command from the external system 2101 is the non-special access command (for example, a general SCSI access command) (Step S2101: NO), the AS_DRV outputs the AS "0" (Step S2103). A command decoder can detect whether the access command is the special access command or the non-special access command. A signal indicating a detection result from the command decoder is input to the AS_DRV, by which the AS_DRV can control whether to output the AS "1" or the AS "0".

According to the fifth embodiment, there are different types of access commands for different types of areas, and an access area is selected between the long string area and the short string area based on a type of an access command. Therefore, it can be considered that the number of bits that constitute a word line address to designate decreases, so that a high-speed read operation can be expected.

The fifth embodiment can include the following variations.

An AS control by a toggle system can be considered. For example, when the number of times of receiving the special access command (or a toggle of a predetermined external pin) is equal to or smaller than $Th_5$, where $Th_5$ is a natural number, the AS "1" can be output, and when it is larger than $Th_5$, the AS "0" can be output.

When accessing the short string area, the external system 2101 can send a special command to the flash memory device before sending an access command, and then send the access command to the flash memory device. When the access command is received after the special access command, the flash memory device can output the AS "1", and when the access command is received without receiving the special access command, the flash memory device can output the AS "0".

In a system in which an address can be output from the beginning with a toggle of a predetermined external pin without inputting any command at the time of booting the system, the number of toggles of the predetermined external terminal (threshold value) is set in advance. Immediately after booting the system, data (for example, boot code data) is output from the short string area, and when the number of toggles of the predetermined external pin reaches the set number, a command is received, by which access to either one of the long string area and the short string area is made possible.

The fifth embodiment is explained above. When three or more areas (memory cell arrays) are arranged, for example, as shown in FIG. 3E, three or more types of read commands are prepared, and an area from which data is read can be selected by the type of a read command.

[Sixth Embodiment]

Figure 26:
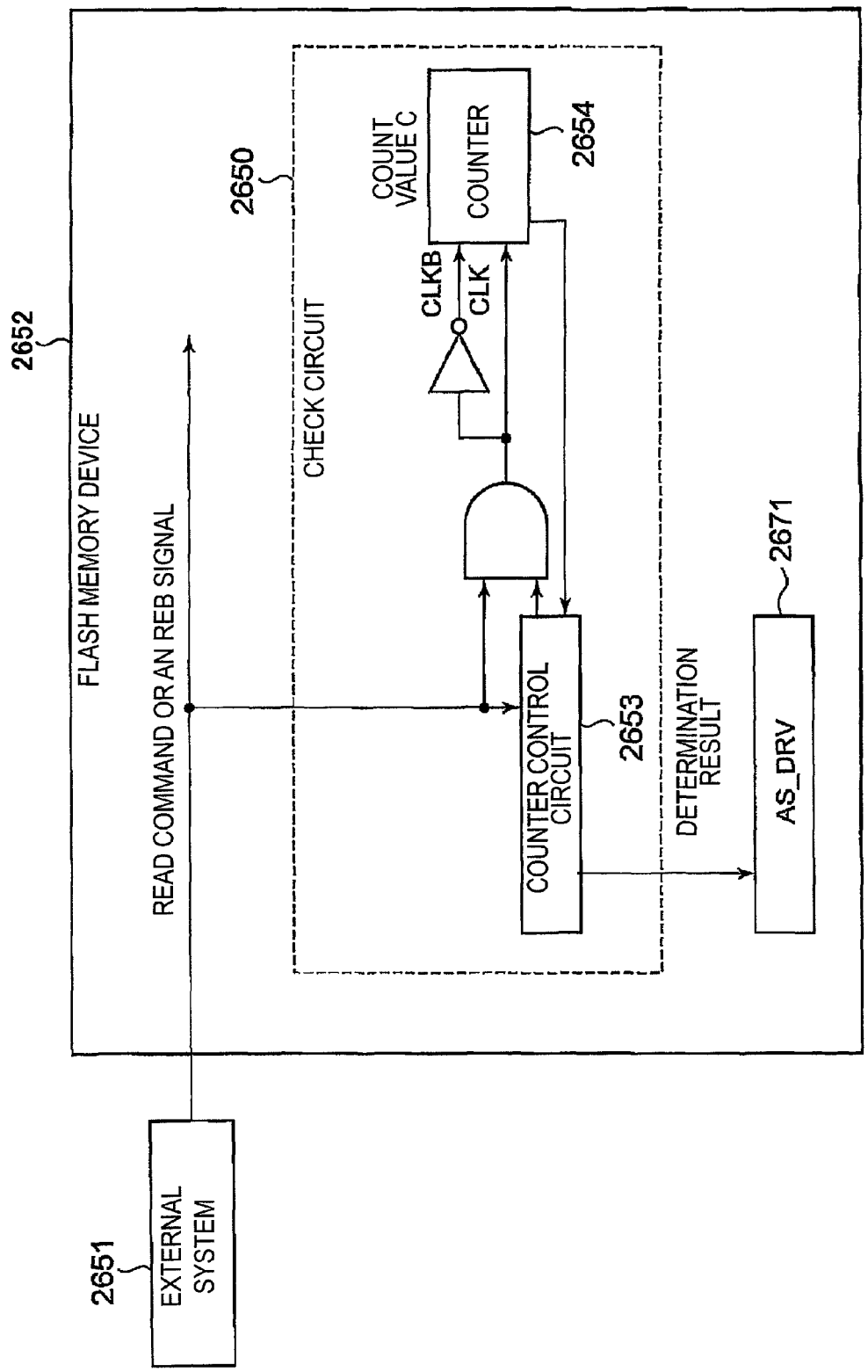
FIG. 26 shows a flash memory system according to a sixth embodiment.

FIG. 26 shows a flash memory system according to the sixth embodiment.

In the sixth embodiment, an area from which a block is selected is determined between the areas 201 and 203 based on a value of the AS. In the sixth embodiment, the short string area 203 is selected until the number of times of receiving a read command reaches $Th_6$, where $Th_6$ is a natural number, and the long string area 201 is selected when the number of times of receiving the read command exceeds $Th_6$.

For example, a flash memory device 2652 includes a check circuit 2650. The check circuit 2650 includes a counter control circuit 2653 and a counter 2654. When a read command (or an REB (Read Enable Bar) signal) from an external system 2651 is detected, the counter control circuit 2653 causes the counter 2654 to update a count value C that indicates the number of times of detecting the read command (or the REB signal). The count value C is stored in a predetermined memory area (register), indicating the number of times of receiving the read command after the external system 2651 is booted. Therefore, for example, when the counter control circuit 2653 detects a signal that is generated at the time of booting the external system 2651 (for example, a power-on signal) or a RESET signal, the counter control circuit 2653 can reset the counter 2654 to a count value 0 (zero). That is, in the sixth embodiment, data is read from the short string area 203 until a predetermined number of read commands after the external system 2651 is booted, and at a read command after that, data is read from the long string area 201. This is effective, for example, for a flash memory system that performs a shadowing (an operation of copying control data to a volatile memory (for example, a RAM (Random Access Memory)) of the external system 2651 at the time of booting the system).

The check circuit 2650 can be included in the external system 2651.

Figure 27:
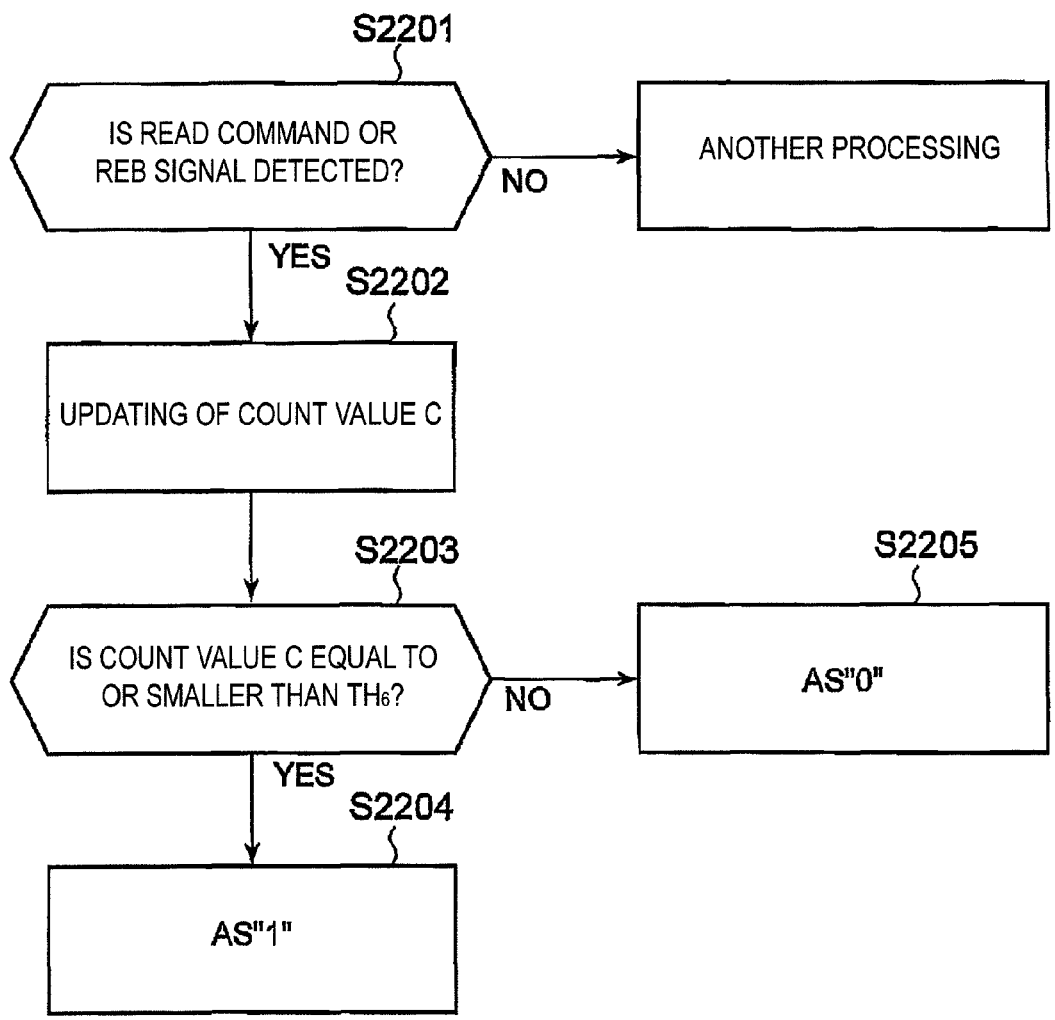
FIG. 27 is a flowchart of an AS switching process according to the sixth embodiment.

FIG. 27 is a flowchart of an AS switching process according to the sixth embodiment.

When the read command or the REB signal is detected (Step S2201: YES), the counter control circuit 2653 causes the counter 2654 to increment the count value C by one (Step S2202). The counter control circuit 2653 compares the updated count value C with $Th_6$, and inputs a signal indicating a result of comparison to an AS_DRV 2671 (Step S2203). When the count value C is equal to or smaller than $Th_6$ (Step S2203: YES), the AS_DRV 2671 outputs the AS "1" (Step S2204). On the other hand, when the count value C is larger than $Th_6$ (Step S2203: NO), the AS_DRV 2671 outputs the AS "0" (Step S2205).

When it is detected even once that the count value C is larger than $Th_6$, the determination at Step S2203 can be skipped. For example, by setting a flag when it is detected that the count value C is larger than $Th_6$, even when the read command or the REB signal is detected afterwards, the AS "0" can be output without performing Step S2203.

The sixth embodiment is as explained above. When three or more areas (memory cell arrays) are arranged, for example, as shown in FIG. 3E, there can be two or more thresholds of the count value C. For example, if the count value C is equal to or smaller than a first threshold, data can be read from the short string area, if the count value C is larger than the first threshold and smaller than a second threshold (the second threshold is larger than the first threshold), data can be read from the middle string area, and if the count value C is larger than the second threshold, data can be read from the long string area.

In at least one of the third to sixth embodiments, for example, it is possible to boot a system as follows.

The short string area 203 has stored therein data (boot code data), which is read when booting an external system (or a flash memory). Access is initially made to the boot code data in the short string area 203 at the time of booting the external system (or the flash memory). Subsequently, after booting the external system (or the flash memory), another external system (such as a controller of a flash memory device) can start accessing to the long string area 201 or the short string area 203 based on the boot code data.

[Seventh Embodiment]

Figure 28:
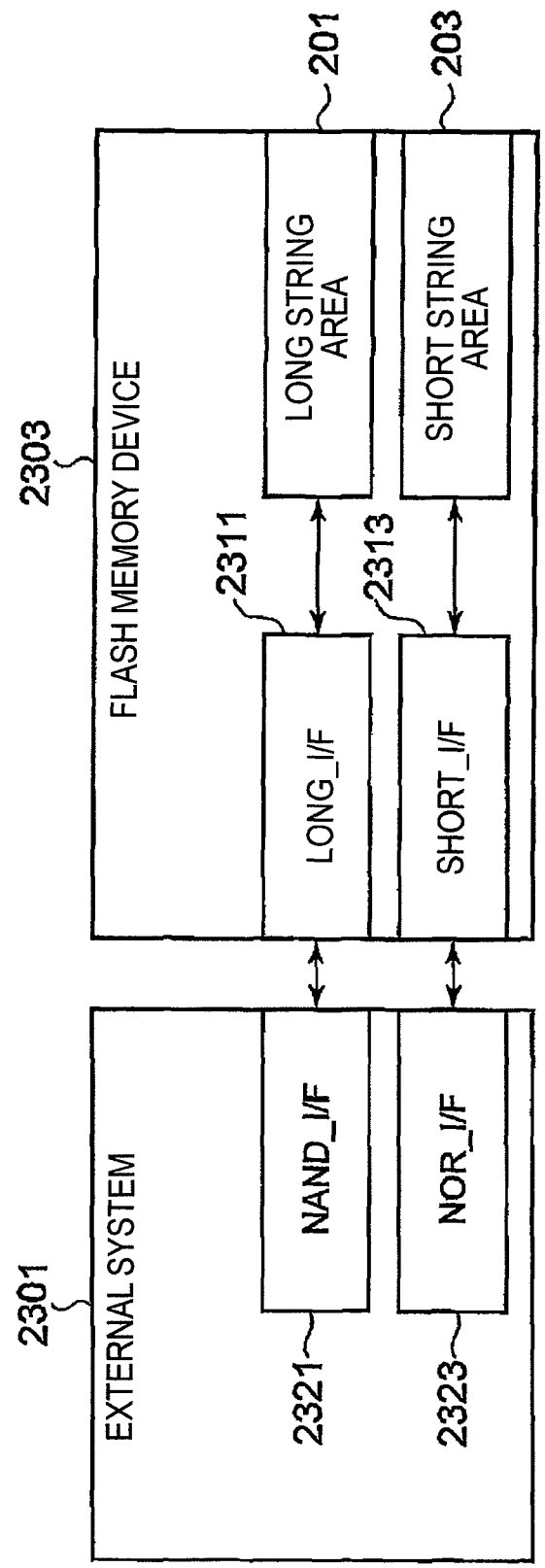
FIG. 28 shows a flash memory system according to a seventh embodiment.

FIG. 28 shows a flash memory system according to the seventh embodiment. In the following explanations, an interface circuit is simply referred to as "I/F".

A device including a NOR flash memory cell array and a NAND flash memory cell array has been known as a flash memory device. For example, an external system 2301 that can write and read data with respect to this type of flash memory device includes, for example, a NAND external I/F (NAND_I/F) 2321 and a NOR external I/F (NOR_I/F) 2323.

In the seventh embodiment, in order to use the NAND_I/F 2321 and the NOR_I/F 2323 included in the external system 2301 in an effective manner (in other words, to take a compatibility with the external system 2301 including such two types of I/Fs), a flash memory system 2303 includes two types of external I/Fs. Specifically, the flash memory system 2303 includes a long_I/F 2311 that is an external I/F for the long string area 201 and a short_I/F 2313 that is an external I/F for the short string area 203. Each of the I/Fs 2311 and 2313 includes a plurality of external terminals.

The NAND_I/F 2321 is electrically connected to the long_I/F 2311, and the NOR_I/F 2323 is electrically connected to the short_I/F 2313. Therefore, an access command output through the NAND_I/F 2321 is received by the long_I/F 2311, and in a process of access command, the long string area 201 is always accessed. On the other hand, an access command output through the NOR_I/F 2323 is received by the short_I/F 2313, and in a process of the access command, the short string area 203 is always accessed.

The seventh embodiment is as explained above. When three or more areas (memory cell arrays) are arranged, for example, as shown in FIG. 3E, three or more external I/Fs corresponding to the three or more areas can be provided in the flash memory system 2303. Furthermore, in the seventh embodiment, an address map (address space) for the long string area 201 and an address map (address space) for the short string area 203 can be provided separately from each other. That is, the XE lines such as the ones in the first to sixth embodiment can be dispensed with. In addition, in the seventh embodiment, the special bit (a bit that becomes "1" exclusively when accessing the short string area 203) can be dispensed with.

[Eighth Embodiment]

Figure 29:
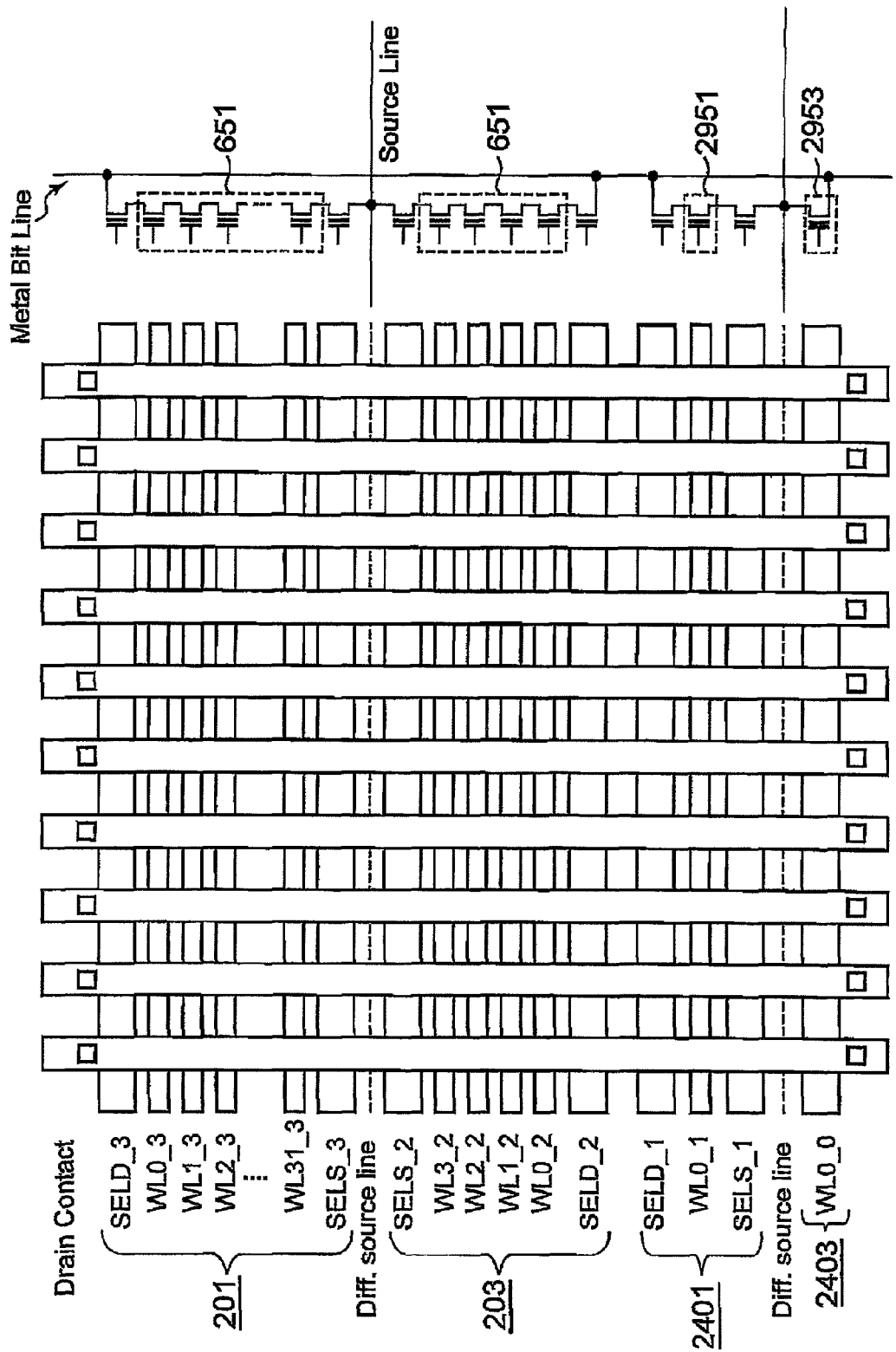
FIG. 29 shows a configuration of a cell array according to an eighth embodiment of the present invention.

FIG. 29 shows a configuration of a cell array according to the eighth embodiment.

A flash memory device includes an area (cell array) 2401 constituted by a first-type 1-cell string 2951 and an area (cell array) 2403 constituted by a second-type 1-cell string 2953, as well as an area (cell array) 201 constituted by a 32-cell string (a string in which the number of memory cells is 32) and an area (cell array) 203 constituted by a 4-cell string. In the eighth embodiment, the short string area 203 described above constitutes a middle string area, and the areas 2401 and 2403 constitute the short string area.

An SELD and an SELS are connected to both ends of a memory cell that constitutes the first-type 1-cell string 2951, respectively. On the other hand, the SELD and the SELS are not connected to a memory cell that constitutes the second-type 1-cell string 2953. That is, in the eighth embodiment, the short string area 2403 constituted by the second-type 1-cell string 2953 without having the SELD and the SLES is provided.

For example, one word line can be enough for a program of control data. In this case, it suffices if an area constituted by a 1-cell string is provided. Generally, a string constituted by a configuration in which a plurality of memory cells connected in series are sandwiched by the SELD and the SELS.

However, in the eighth embodiment, it is possible to adopt the second-type 1-cell string 2953 described above without having the SELD and the SELS. For example, it is also possible to take a configuration of the cell array of the flash memory device only with the long string area 201 and the short string area 2403 constituted by the second-type 1-cell string 2953.

Because there are no SELD and SELS in the short string area 2403 (it is possible to use only one transistor to constitute a 1-cell string), a dimension of the area 2403 can be smaller than a dimension of the area 2401.

As an operation of the second-type 1-sell string 2953, for example, if a word line corresponding to the second-type 1-cell string 2953 is not selected, a WL voltage of the word line is set to 0 V (a non-conductive state), and at the time of a read operation (a selecting operation), a voltage having the same magnitude as a voltage supplied to each of the SELD and the SLES (for example, 2.5 V) can be supplied. Furthermore, at the time of deleting data in the second-type 1-cell string 2953, a high voltage (for example, 20 V) is applied to a well including the second-type 1-cell string 2953, and the WL voltage of 0 V is supplied to only a word line that passes the 1-cell string (other word lines in the well become floating). In this manner, even in an area constituted by the second-type 1-cell string 2953 without having the SELD and the SELS, it is possible to perform the same NAND control as that in other areas.

A memory cell of the second-type sell string 2953 can be, for example, a transistor the same as the nonvolatile SELD and SELS, and can be a transistor the same as a memory cell that constitutes the other strings.

[Ninth Embodiment]

In the ninth embodiment, sequential read is performed with a single read command (specifying a single word line address). Specifically, data read from the short string area and data read from the long string area are performed in a sequential manner.

Figure 30:
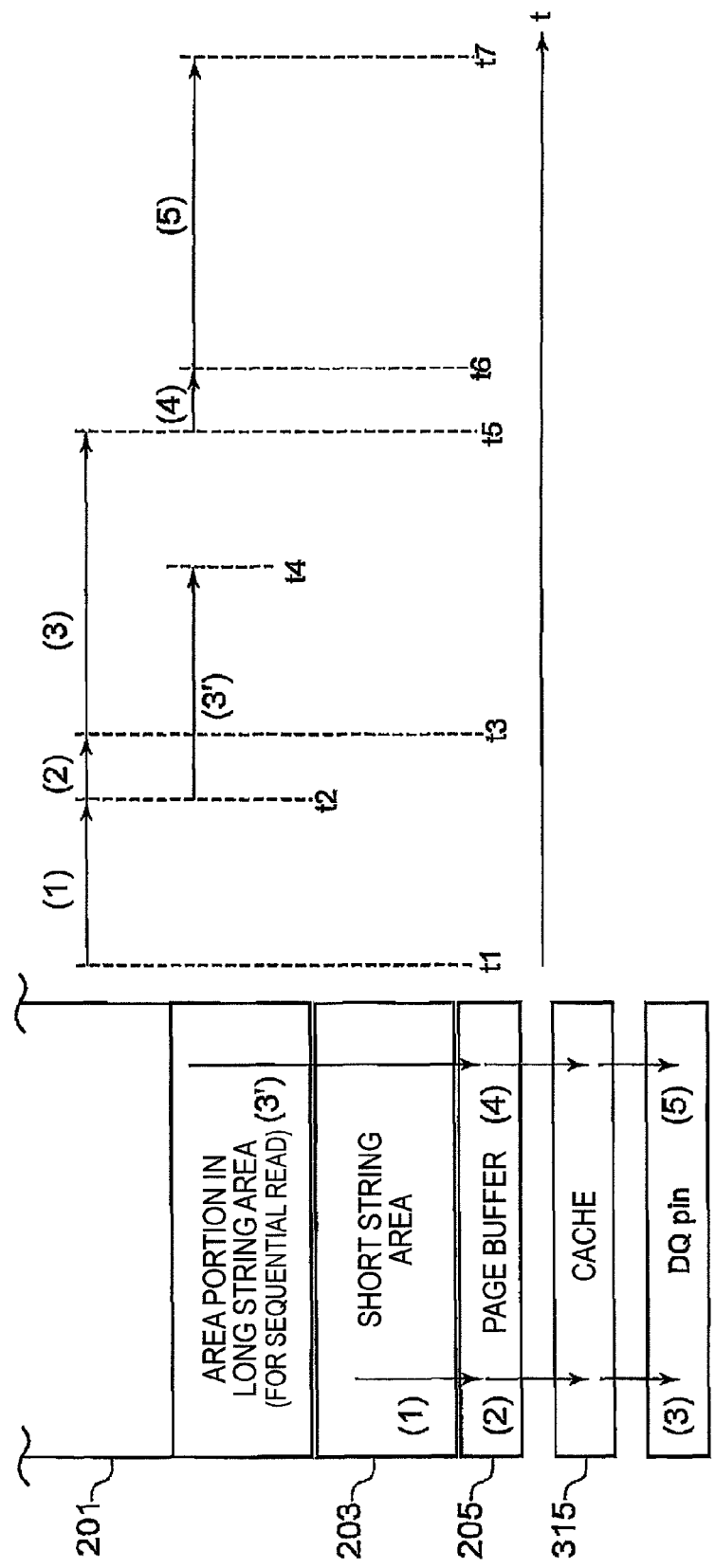
FIG. 30 shows an outline of sequential read according to a ninth embodiment.

FIG. 30 shows an outline of sequential read according to the ninth embodiment.

In the sequential read, during data read from the short string area 203 and stored in the page buffer 205 are output from the page buffer 205 to the cache area 315 and output from the cache area 315 to the DQ pin (or immediately after the data is output), data is read from the long string area 201 and stored in the page buffer 205. When all the data read from the short string area 203 is output to the DQ pin, the data read from the long string area 201 is output from the page buffer 205 to the cache area 315, and thereafter the data is output from the cache area 315 to the DQ pin.

When a word line address for the sequential read is designated in the read command, the sequential read process is performed in the following order.

(1) Data of 2 KB (hereinafter, "data S") is read from the short string area 203 and stored in the page buffer 205 in a period from a time t1 to a time t2.

(2) The data S is output from the page buffer 205 to the cache area 315 in a period from the time t2 to a time t3.

(3') At the time t2 (or the time t3 when the data output is completed), reading of data of 2 KB (hereinafter, "data L") form the long string area 201 starts. That is, before a transfer of the data S from the page buffer 205 to the cache area 315 is completed, storing the data L in the page buffer 205 can be started. However, the data S is not erased by the data L.

(3) The data S is output from the cache area 315 to the DQ pin in a period from the time t3 to a time t5. During this time, the external system 101 receives the data S. Reading of the data L started at the time t2 (or t3) is completed at a time t4 between the time t3 and the time t5. In this manner, with the output of the data S performed in the period from the time t2 (or t3) to the time t5, the time taken to read the data L is hidden in the external system 101.

(4) The data S is output from the page buffer 205 to the cache area 315 at a period from the time t5 to a time t6.

(5) The data L is output from the cache area 315 to the DQ pin in a period from the time t6 to a time t7. During this time, the external system 101 receives the data L. Therefore, according to the example shown in FIG. 30, the time during which the external system 101 waits for the data L is not the time taken to read the data L but a shorter time (a transfer time to the cache area 315 (t5 to t6)).

With this process, the time from sending the read command to receiving the first data is short in the external system 101. It is because the data is read from the short string area 203 at the beginning. Furthermore, the time required to read the data from the long string area 201 is hidden in the external system 101. It is because reading data from the long string area 201 is performed during the data read from the short string area 203 is output from the page buffer 205 to the DQ pin (or immediately after the data is output).

In the ninth embodiment, it is possible to set a size of the page buffer 205 to a half (for example, 2 KB) of a page size (for example, 4 KB). It is because data having a size of a half of the page size is read two times in a sequential manner.

The ninth embodiment is explained below in more detail.

For example, a part of an area portion of the long string area 201 is used for the sequential read. A memory capacity of the area portion is the same as that of an area for the sequential read in the short string area 203. For example, the memory capacity of the short string area 203 is ⅛ of the whole area, and the entire area of the short string area 203 is used for the sequential read. Therefore, in the ninth embodiment, an area portion of ⅛ of the whole area is used for the sequential read from among the long string area 201. That is, ¼ of the whole area is used for the sequential read. For example, if the memory capacity of the long string area 201 is 70 GB and the memory capacity of the short string area 203 is 10 GB, because the entire area of the short string area 203 is used for the sequential read (the memory capacity for the sequential read is 10 GB), an area portion of the long string area 201 (the memory capacity for the sequential read is 10 GB from 70 GB) is used as the area for the sequential read (the memory capacity for the sequential read is 10 GB). Therefore, among the memory capacity of the whole area (70 GB+10 GB=80 GB) that is a sum of the memory capacity of the long string area 201 (70 GB) and the memory capacity of the short string area 203 (10 GB), a memory capacity of 20 GB, which is a sum of the memory capacity of the short string area 203 (10 GB) and the memory capacity of the part of the long string area 201 (10 GB), is used for the sequential read. The memory capacity of 20 GB is ¼ of the whole memory capacity GB. It is preferable that the area portion for the sequential read in the long string area 201 be an area portion closest to the short string area 203 (a neighboring area portion) as shown in FIG. 30.

Figure 31:
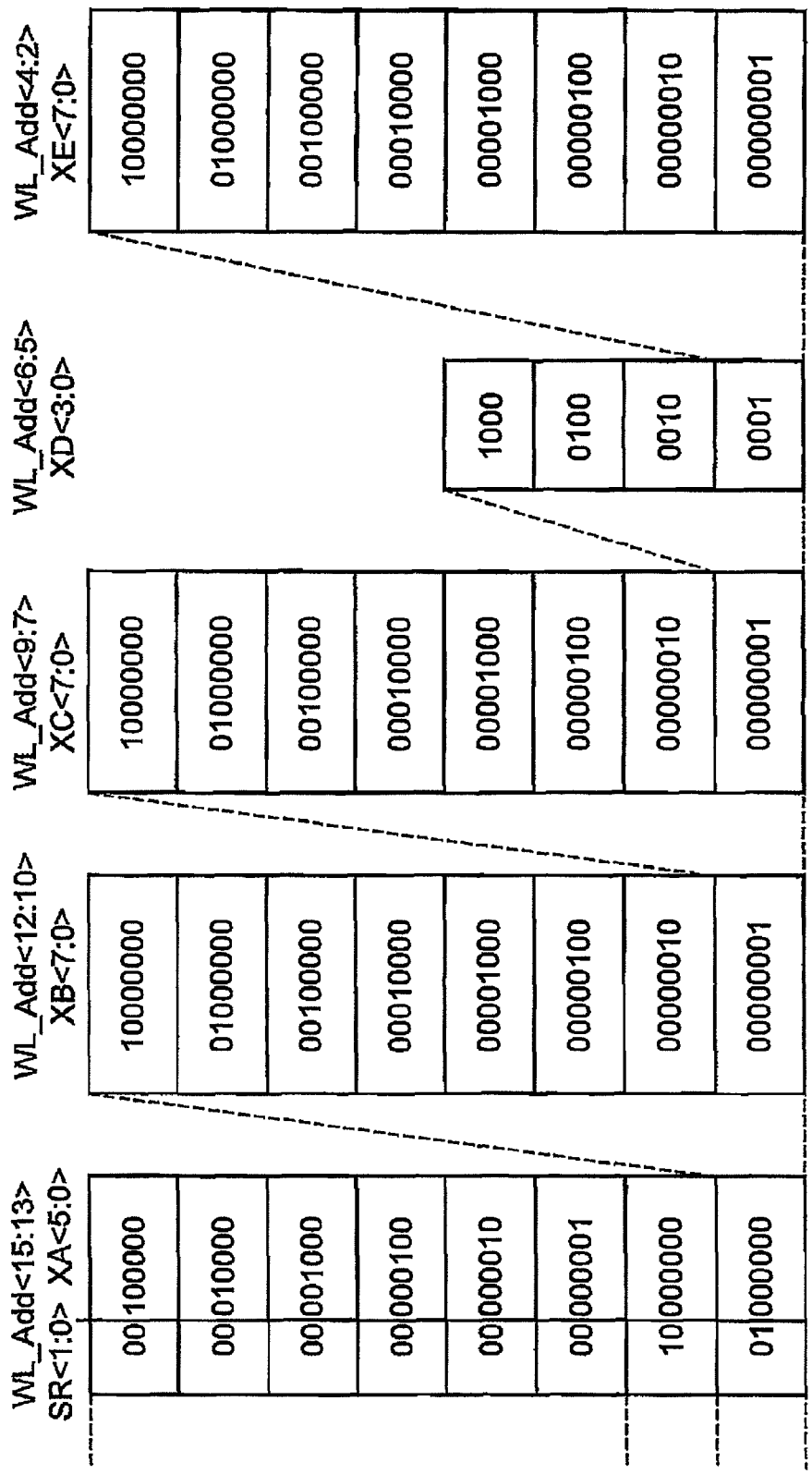
FIG. 31 shows a relation between a word-line address map according to the ninth embodiment and a signal level of an SR signal.

FIG. 31 shows a relation between a word-line address map according to the ninth embodiment and a signal level of an SR (Sequential Read) signal.

In view of a fact that ¼ of the whole area is used for the sequential read, a relation between the word-line address map and the signal level of the SR signal as shown in FIG. 31 is adopted. That is, the number of XA lines is reduced to six, and two SR lines through which a 2-bit SR signal (SR<1:0>) flows are provided instead. In the ninth embodiment, a decoder for generating the signals XA and SR (an SR/XA-DEC 2701) is included in the flash memory device.

Figure 32:
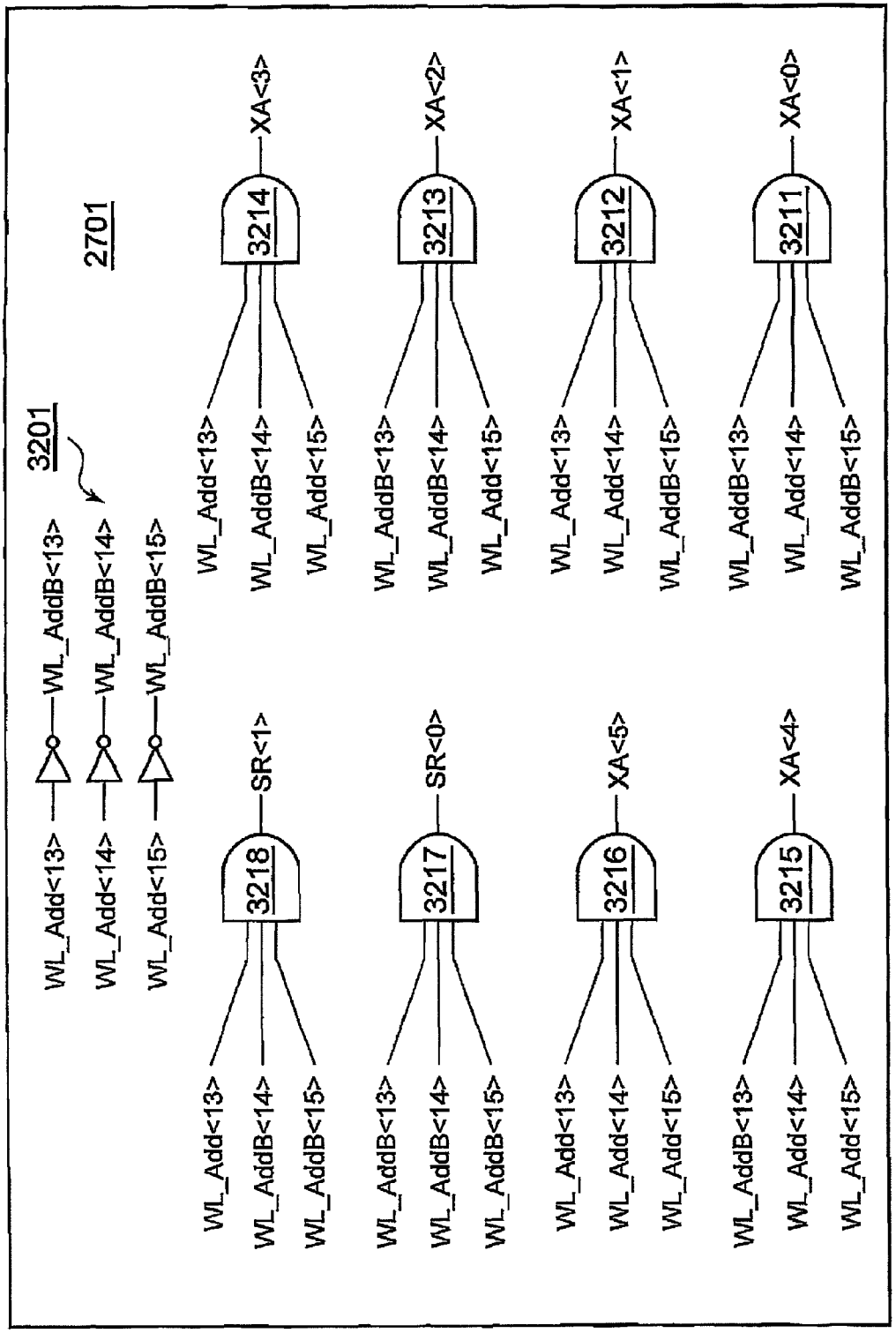
FIG. 32 shows a configuration of an SR/XA-DEC.

FIG. 32 shows a configuration of the SR/XA-DEC 2701.

The SR/XA-DEC 2701 includes a NOT circuit group 3201 including three NOT circuits that respectively invert three bits that constitute the WL_Add<15:13>. Signals obtained by inverting a WL_Add<13>, a WL_Add<14>, and a WL_Add<15> are represented by a WL_AddB<13>, a WL_AddB<14>, and a WL_AddB<15>, respectively.

The SR/XA-DEC 2701 further includes eight AND circuits 3211 to 3218 that respectively output six bits that constitute an XA<5:0> and two bits that constitute the SR<1:0>. Each of the AND circuits 3211 to 3218 includes three input pins to which at least one bit of the WL_Add<15:13> and/or at least one of the WL_AddB<15:13> are input.

FIG. 33 shows a truth table of the SR/XA-DEC 2701.

A result shown in the truth table of FIG. 33 is obtained from the configuration shown in FIG. 32.

As shown in FIGS. 32 and 33, a word line address including WL_Add<15:14>=<0,0> is the address for the sequential read. That is, at this time, XA<5:4>=<0,0>, and either one of two bits that constitute the SR<1:0> is set to "1". On the other hand, when WL_Add<15:14> is not <0,0>, any one of the XA<5:0> is set to "1".

When SR<1:0>=<0,1>, all the bits that constitute the XA<5:0> are "0", and any one of each of the XB<7:0>, the XC<7:0>, the XD<3:0>, and the XE<7:0> is set to "1". Therefore, a block is selected from the short string area 203 and data is read from the selected block.

When SR<1:0>=<0,1> or <0,0>, all the bits that constitute the XE<7:0> are "0", and any one of each of the XA<5:0>, the XB<7:0>, the XC<7:0>, and the XD<3:0> is set to "1". Therefore, a block is selected from the long string area 201 and data is read from the selected block.

In the ninth embodiment, when a word line address including WL_Add<15:14>=<0,0> is designated, data is read from the short string area 203 first with SR<1:0>=<0,1>, and then data is read from the long string area 201 with SR<1:0>=<1,0>.

If the boot code data and the management data are programmed in the short string area 203 and data read after the boot code data is read and data identified by the management data are stored in the area portion for the sequential read in the long string area 201, preferable boot and read can be expected.

Furthermore, in the ninth embodiment, although the sequential read is performed with a single read command (designating a single word line address), instead of this, the sequential read can be performed by a special read command (normal read, not the sequential read, can be performed with a normal read command).

In addition, the aspect of the sequential read described above can be applied to a program. For example, when a program command designating a word line address for a sequential program is received (or a special program command is received) from the external system 101, the following process can be performed.

Data to be programmed in the short string area 203 is first transferred from the DQ pin to the cache area 315, transferred from the cache area 315 to the page buffer 205, and then transferred from the page buffer 205 to the short string area 203.

During the data to be programmed in the short string area 203 is transferred from the page buffer 205 to the short string area 203 (for example, when the transfer is started), a transfer of data to be programmed in the long string area 201 from the cache area 315 to the page buffer 205 is started. Thereafter, the data is transferred from the page buffer 205 to the long string area 201.

The sequential read or the sequential program described above can be performed when reading or programming large-size data larger than one page (or one block). Therefore, for example, a part of data can be programmed in the short string area 203 and the rest of the data is programmed in the long string area 201. When such a programming is performed, by performing the sequential read described above, it is possible to read the part of the data and the rest of the data in a continuous manner.

According to the sequential read described above, the following process is also possible. For example, when a target data group to be read is stored across the long string area 201 and the short string area 203, data that constitutes one part of the target data group is first read from the short string area 203, and then data that constitutes the other part of the target data group is read from the long string area 201 in association with the data read from the short string area 203.

[Tenth Embodiment]

Figure 34:
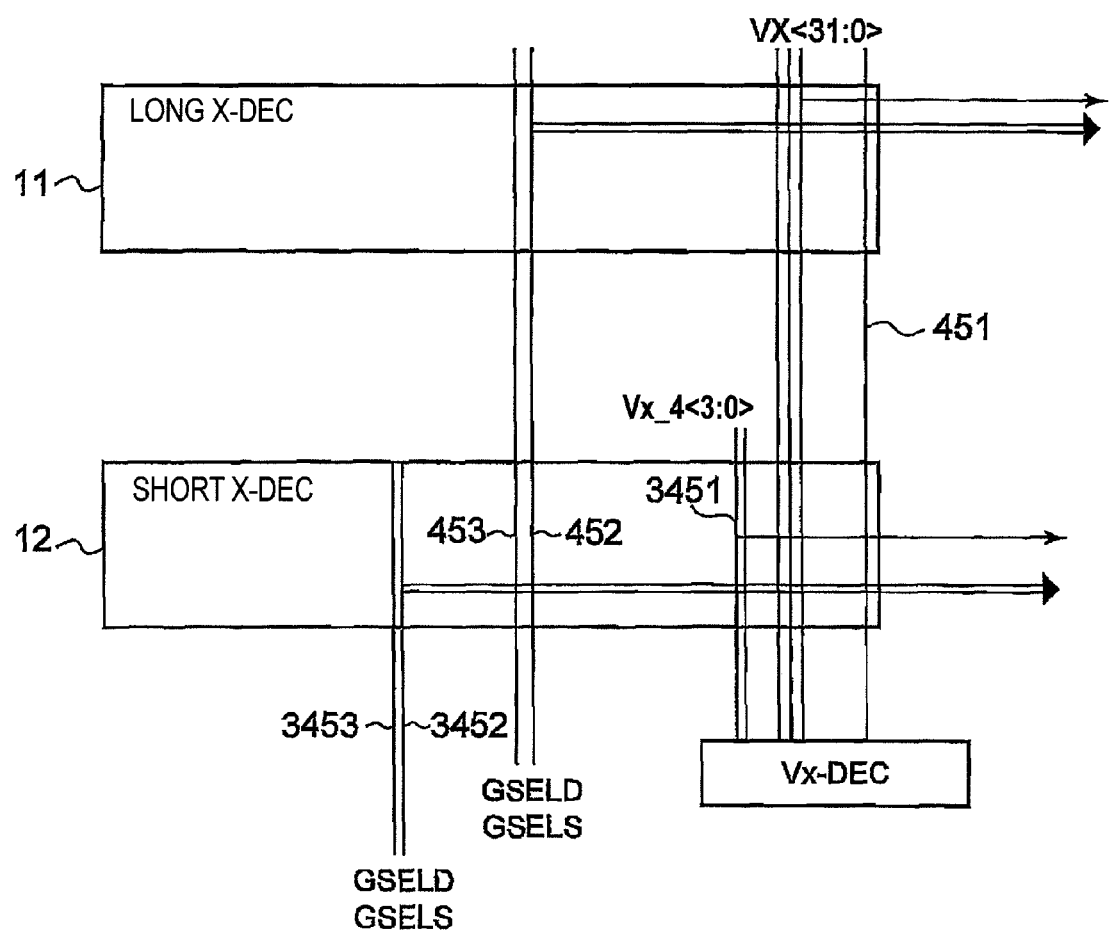
FIG. 34 shows a wiring relevant to an X-DEC unit according to a tenth embodiment.

FIG. 34 shows a wiring relevant to a long X-DEC and a short X-DEC according to the tenth embodiment.

In the tenth embodiment, the 32 Vx lines 451 through which the Vx<31:0> flows are not common to the long X-DEC and the short X-DEC. That is, the 32 Vx lines 451 are connected to the long X-DEC, but not to the short X-DEC. In the tenth embodiment, Vx lines 3451 of four word lines are dedicated for the short X-DEC (Vx lines through which a Vx_4<3:0> flows).

Furthermore, in the tenth embodiment, the GSELD line and the GSELS line are not common to the long X-DEC and the short X-DEC. That is, the GSELD line 452 and the GSELS line 453 are connected to the long X-DEC, but not to the short X-DEC. In the tenth embodiment, a GSELD line 3452 and a GSELS line 3453 are dedicated for the short X-DEC.

According to the tenth embodiment, because the Vx line, the GSELD line, and the GSELS line are provided to the short string area and the long string area in a separate manner, compared to a case where the Vx line, the GSELD line, and the GSELS line are common to the long X-DEC and the short X-DEC, a high-speed read operation can be expected. In addition, in the tenth embodiment, because the Vx line, the GSELD line, and the GSELS line are provided in a separate manner, it is possible that a word line in the long string area and a word line in the short string area are raised at the same time.

[Eleventh Embodiment]

Figure 35:
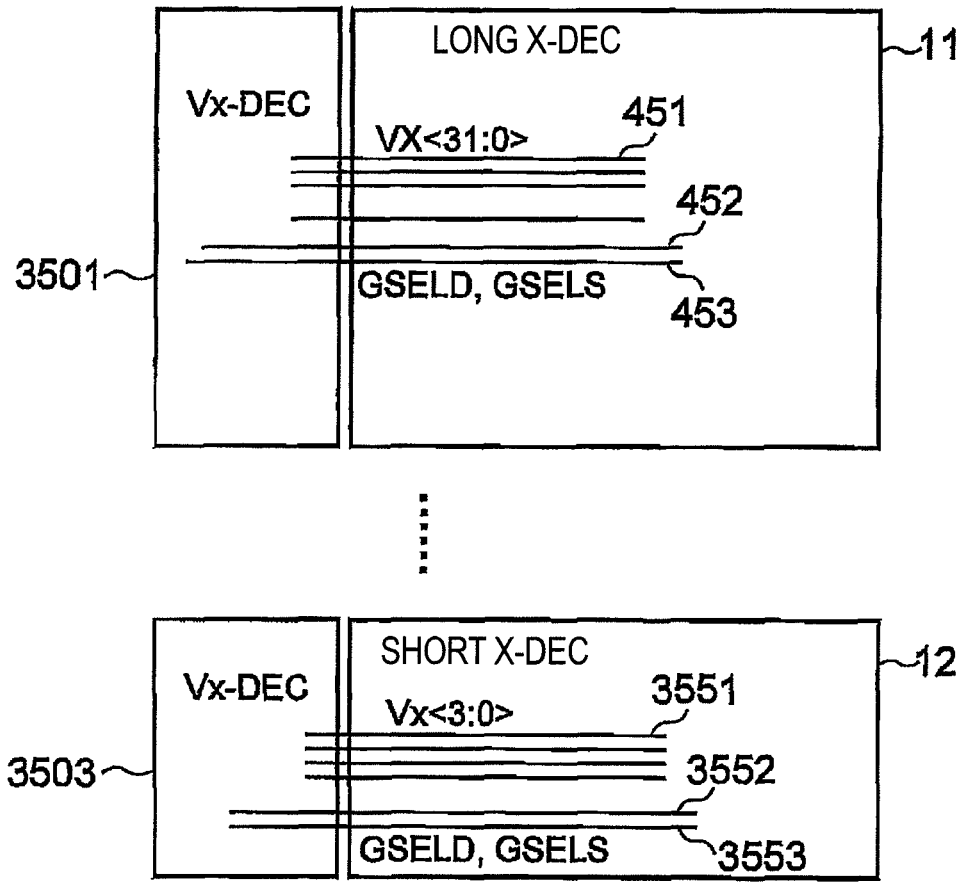
FIG. 35 shows a wiring relevant to an X-DEC unit according to an eleventh embodiment.

FIG. 35 shows a wiring relevant to a long X-DEC and a short X-DEC according to the eleventh embodiment.

In the eleventh embodiment, the Vx-DEC is provided to the long X-DEC and the short X-DEC in a separate manner, as well as the Vx line 451, the GSELD line 452, and the GSELS line 453. A Vx-DEC 3501 for the long string area and a Vx-DEC 3503 for the short string area are provided. The Vx-DEC 3501 for the long string area is arranged, for example, near the long X-DEC 11, more specifically, for example, next to the long X-DEC (−X direction side). Similarly, the Vx-DEC 3503 for the short string area is arranged, for example, near the short X-DEC 12, more specifically, for example, next to the short X-DEC 12 (−X direction side).

According to the eleventh embodiment, because the Vx-DEC is provided to each of the long string area 201 and the short string area 203 in a separate manner, compared to a case where the Vx-DEC is common to the long string area 201 and the short string area 203, a high-speed read operation can be expected.

While exemplary embodiments of the present invention have been explained above, it is needless to mention that the present invention is not to these embodiments, and various changes can be made without departing from the scope of the invention. For example, it is possible to combine two or more of the first to eleventh embodiments.

What is claimed is:

1. A nonvolatile semiconductor memory device comprising:
    a first memory cell array including at least one first string group constituted of a plurality of first strings, each of the first strings including a first number of first memory cells each storing therein information in a nonvolatile manner, each of the first memory cells being connected to an associated one of a plurality of first word lines:,
    a second memory cell array including at least one second string group constituted of a plurality of second strings, each of the second strings including a second number of second memory cell or cells each storing therein information in a nonvolatile manner, the second number being smaller than the first number, each of the second memory cell or cells being connected to a second word line or an associated one of a plurality of second word lines;
    a first bit line connected to one of the first strings;
    a second bit line connected to one of the second strings;
    a page buffer that stores therein data read from the first and second memory cell arrays via the first and second bit lines, respectively; and
    a control circuit performing reading first data from the first memory cell array after reading second data from the second memory cell array in first time read access after a power is supplied to the nonvolatile semiconductor memory device, thereby the second data and the first data are supplied to the page buffer in a time series manner.

2. The nonvolatile semiconductor memory device as claimed in claim 1, further comprising:
    an output node of the page buffer, wherein
    when a data group to be read is stored across the first and second memory cell arrays,
    the control circuit reads a part of data of the data group from the second memory cell array and supplies the part of data to the page buffer, and then reads rest of the data of the data group from the first memory cell array and supplies the rest of the data to the page buffer, and
    the page buffer outputs the part of the data and then the rest of the data in a time series manner through the output node.

3. A nonvolatile semiconductor memory device comprising:
    a first string including a first number of memory cells connected in series each storing therein information in a nonvolatile manner;
    a second string including a second number of memory cells connected in series each storing therein information in a nonvolatile manner, the second number being smaller than the first number;
    a bit line connected to ends of each of the first and second strings; and
    a page buffer connected to the bit line,
    wherein the second string is arranged between the first string and the page buffer.

4. The nonvolatile semiconductor memory device as claimed in claim 3, wherein
    the nonvolatile semiconductor device includes at least two of the second strings, and the at least two second strings are arranged between the first string and the page buffer in series.

5. The nonvolatile semiconductor memory device as claimed in claim 3, further comprising:
a cache memory connected to a node of the page buffer;
an I/O buffer connected to a node of the cache memory; and
an I/O terminal connected to a node of the I/O buffer so as to communicate with outside, wherein
data related to the bit line is outputted to outside through the page buffer, the cache memory, the I/O buffer, and the I/O terminal in this order.

6. A nonvolatile semiconductor memory device comprising:
a first string including a first number of memory cells connected in series each storing therein information in a nonvolatile manner;
a second string including a second number of memory cells connected in series each storing therein information in a nonvolatile manner, the second number being smaller than the first number;
a first bit line connected to one end of the first string;
a second bit line connected to one end of the second string; and
a first page buffer connected to the first bit line, the first page buffer being arranged between the first and second strings.

7. The nonvolatile semiconductor memory device as claimed in claim 6, further comprising:
a second page buffer connected to the second bit line,
wherein the first and second page buffers are arranged between the first and second strings in series such that the first and second page buffers are adjacent to corresponding ones of the first and the second strings, respectively.

8. The nonvolatile semiconductor memory device as claimed in claim 7, further comprising:
a cache memory connected to a node of each of the first and second page buffers;
an I/O buffer connected to a node of the cache memory; and
an I/O terminal connected to a node of the I/O buffer so as to communicate with outside, wherein
data related to the first and second bit lines are outputted to outside through the first or second page buffer, the cache memory, the I/O buffer, and the I/O terminal in this order.

9. The nonvolatile semiconductor memory device as claimed in claim 3, further comprising a third string including a third number of memory cells connected in series each storing therein information in a nonvolatile manner, the third number being smaller than the first number and larger than the second number.

10. The nonvolatile semiconductor memory device as claimed in claim 9, further comprising:
a bit line connected to one end of each of the first to third strings; and
a page buffer connected to the bit line.

11. The nonvolatile semiconductor memory device as claimed in claim 10, wherein the third string is arranged between the first and second strings.

12. The nonvolatile semiconductor memory device as claimed in claim 11, wherein the second string is arranged between the third string and the page buffer.

13. The nonvolatile semiconductor memory device as claimed in claim 9, further comprising:
a cache memory connected to a node of the page buffer;
an I/O buffer connected to a node of the cache memory; and
an I/O terminal connected to a node of the I/O buffer so as to communicate with outside, wherein
data related to the bit line is outputted to outside through the page buffer, the cache memory, the I/O buffer, and the I/O terminal in this order.

14. The nonvolatile semiconductor memory device as claimed in claim 1, wherein the second memory cell array is arranged closer to the page buffer than the first memory cell array.

15. The nonvolatile semiconductor memory device as claimed in claim 1, wherein the second memory cell array is arranged between the page buffer and the first memory cell array.

16. The nonvolatile semiconductor memory device as claimed in claim 1, wherein a maximum distance between the page buffer and the second memory cell array along the second bit line is shorter than a maximum distance between the page buffer and the first memory cell array along the first bit line.

17. The nonvolatile semiconductor memory device as claimed in claim 1, wherein the first and second bit lines are connected to each other to form a common bit line.

18. The nonvolatile semiconductor memory device as claimed in claim 1, further comprising:
a word line decoder connected to the first and second word lines, wherein
the first memory cell array, the second memory cell array, the page buffer, and the word line decoder are included in a single memory plane, and
the nonvolatile semiconductor device includes at least two memory planes.

19. The nonvolatile semiconductor memory device as claimed in claim 1, further comprising:
a third memory cell array including at least one third string group constituted of a plurality of third strings, each of the third strings including a third number of third memory cells each storing therein information in a nonvolatile manner,
the third number being smaller than the first number and larger than the second number, each of the third memory cells being connected to an associated one of a plurality of third word lines.

20. The nonvolatile semiconductor memory device as claimed in claim 1, further comprising:
a selecting unit that selects either one of the first and second memory cell arrays based on a selection signal.

21. The nonvolatile semiconductor memory device as claimed in claim 20, wherein the selection signal is obtained from a signal externally supplied to the nonvolatile semiconductor memory device.

22. The nonvolatile semiconductor memory device as claimed in claim 20, further comprising:
a circuit that generates the selection signal, wherein
the selection signal has either one of a first level corresponding to a first event and a second level corresponding to a second event,
the selecting unit selects the first memory cell array when the selection signal has the first level, and
the selecting unit selects the second memory cell array when the selection signal has the second level.

23. The nonvolatile semiconductor memory device as claimed in claim 20, further comprising:
a plurality of address decode lines supplied with an address decode signal, wherein
the selecting unit decodes a word line address signal to generate the address decode signal that is constituted of a plurality of bits, the address decode signal is used for selecting or non-selecting the first and second string groups, the address decode lines include at least two first address decode lines, at least two second address decode lines, and at least two third address decode lines, the at least two second address decode lines are connected in common to the first and second strings, selecting or non-selecting the first string group is controlled based on the address decode signal flowing through the at least two first address decode lines and the address decode signal flowing through the at least two second address decode lines, selecting or non-selecting the second string group is controlled based on the address decode signal flowing through the at least two second address decode lines and the address decode signal flowing through the at least two third address decode lines, and the address decode signal flowing through the at least two third address decode lines is generated based on the selection signal.

24. The nonvolatile semiconductor memory device as claimed in claim 20, further comprising:

a plurality of power source lines corresponding to the first word lines common to the first string group and the second word line common to the second string group, wherein the selecting unit controls a level of a voltage supplied to each of the power source lines based on the selection signal.

25. The nonvolatile semiconductor memory device as claimed in claim 1, wherein the second number is "1", and each of the second strings is constituted by one memory cell.

26. The nonvolatile semiconductor memory device as claimed in claim 3, further comprising:

a control circuit performing reading first data via the first bit line from the first string after reading second data via the second bit line from the second string.

27. The nonvolatile semiconductor memory device as claimed in claim 3, further comprising:

a memory space where control information is stored, a circuit making an access to one of the first and second memory cell arrays based on the control information of the memory space.

28. The nonvolatile semiconductor memory device as claimed in claim 6, wherein the first page buffer is connected to both of the first bit line and the second bit line to read data via the first and second bit lines, respectively.

* * * * *